United States Patent [19]

Tsubosaki et al.

[11] Patent Number: 5,583,375
[45] Date of Patent: Dec. 10, 1996

[54] SEMICONDUCTOR DEVICE WITH LEAD STRUCTURE WITHIN THE PLANAR AREA OF THE DEVICE

[75] Inventors: Kunihiro Tsubosaki, Hino; Michio Tanimoto; Kunihiko Nishi, both of Kokubunji; Masahiro Ichitani; Shunji Koike, both of Kodaira; Kazunari Suzuki, Tokyo; Ryosuke Kimoto, Tachikawa; Ichiro Anjoh, Koganei; Taisei Jin, Musashino; Akihiko Iwaya, Fuchuu; Gen Murakami, Tama; Masamichi Ishihara, Hamura-machi; Junichi Arita, Musashino, all of Japan

[73] Assignees: Hitachi, Ltd.; Hitachi Microcomputer System, Ltd., both of Tokyo, Japan

[21] Appl. No.: 990,633

[22] Filed: Dec. 14, 1992

Related U.S. Application Data

[63] Continuation of Ser. No. 713,289, Jun. 11, 1991, abandoned.

[30] Foreign Application Priority Data

Jun. 11, 1990 [JP] Japan .................................. 2-153183
Jul. 26, 1990 [JP] Japan .................................. 2-198462

[51] Int. Cl.$^6$ ......................................... H01L 23/48
[52] U.S. Cl. ........................ 257/692; 257/696; 257/686; 257/787; 257/706
[58] Field of Search .................................. 257/686, 777, 257/706, 692, 693, 666, 696, 787, 684

[56] References Cited

U.S. PATENT DOCUMENTS

| 4,092,697 | 5/1978 | Spaight .................................. 257/706 |
| 4,989,069 | 1/1991 | Hawkins ................................ 257/693 |
| 5,266,834 | 11/1993 | Nishi et al. . | |

FOREIGN PATENT DOCUMENTS

| 61-101067 | 5/1986 | Japan . |
| 63-10665 | 7/1989 | Japan . |

*Primary Examiner*—Jerome Jackson, Jr.
*Assistant Examiner*—Nathan K. Kelley
*Attorney, Agent, or Firm*—Antonelli, Terry, Stout & Kraus

[57] ABSTRACT

A semiconductor device having inner leads secured via insulating adhesive films to the principal surface of a semiconductor chip and electrically connected to the respective external terminals of the semiconductor chip. The semiconductor device that can be about the size of the chip is so configured that an outer lead is continuously extended from each inner lead up to the rear surface opposite to the principal surface of the semiconductor chip in order to hold the leads and an external device in conduction.

39 Claims, 25 Drawing Sheets

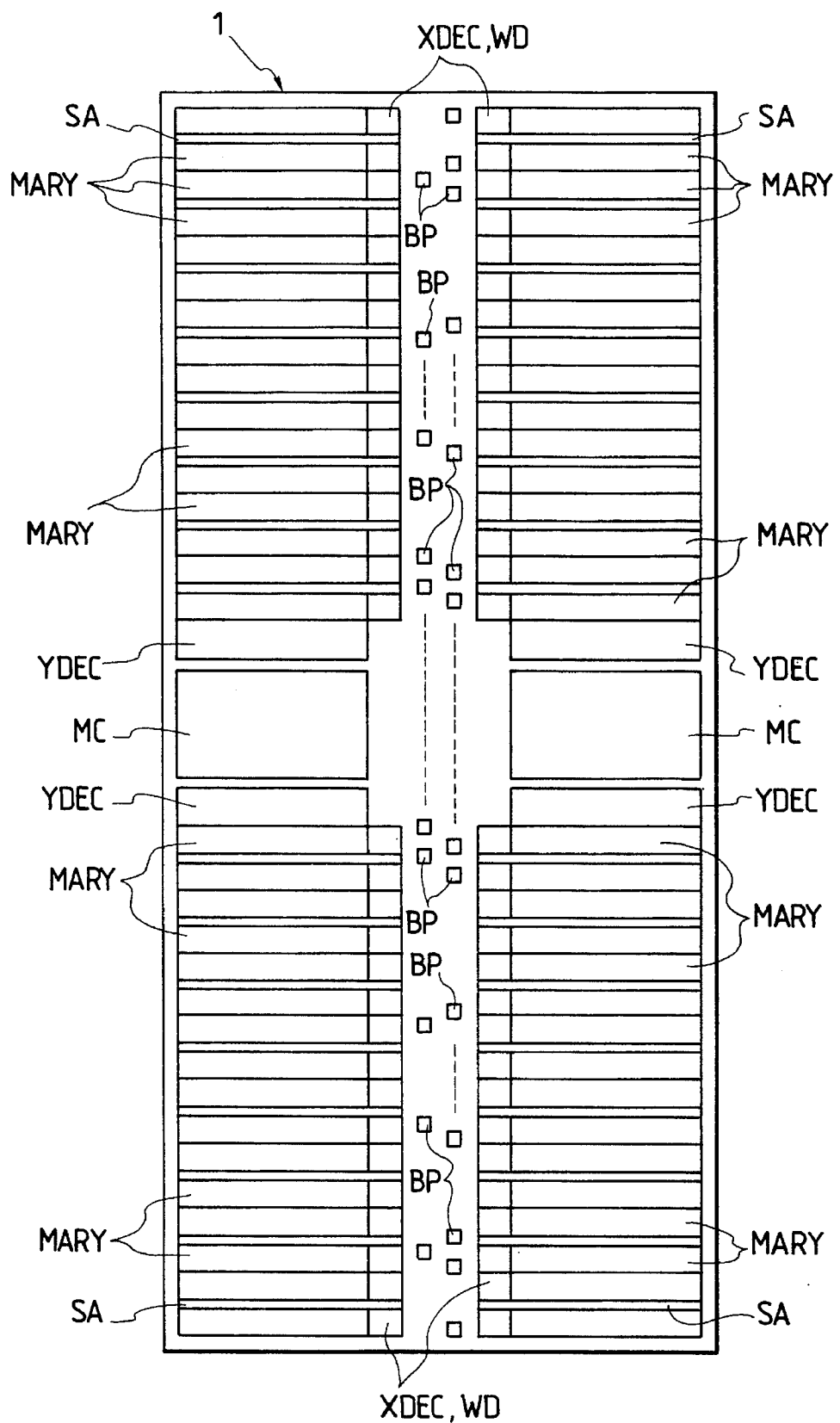

SEMICONDUCTOR DEVICE WITH LEAD STRUCTURE WITHIN THE PLANAR AREA OF THE DEVICE

This is a continuation of application Ser. No. 713,289, filed Jun. 11, 1991, now abandoned.

BACKGROUND OF THE INVENTION

The present invention relates to semiconductor devices and stacked semiconductor devices, and more particularly to the suitably applicable art of constructing a semiconductor device and a stacked semiconductor device in which leads and external terminals of a semiconductor chip are electrically connected on the principal surface of the semiconductor chip having circuits thereon.

One of the conventional resin-molded small-sized semiconductor devices, as disclosed by U.S. Pat. No. 4,943,843, for instance, is of LOC (Lead On Chip) construction in which before being resin-molded, a plurality of inner leads are secured via an insulating film to the principal surface where semiconductor element circuitry is formed and gold wires are used for wire bonding.

Moreover, there have heretofore been proposed the following:

A TAB (Tape Automated Bonding) method, as described in Japanese Patent Laid-Open No. 217933/1989, comprises the steps of projecting finger-like leads in a device hole, bonding a semiconductor chip to the tips of the leads by faceup registration, molding the chip in resin or the like, and fitting a frame member to a tape carrier to prevent the outer leads from protruding from the edge of the tape or bending the outer leads up to the rear surface of the frame member.

A thin semiconductor device, as described in Japanese Patent Laid-Open No. 186390/1989, is provided with a molded semiconductor chip in a package, and leads, each having one end connected to the semiconductor chip and other exposed to the outside of the package on the rear surface thereof, and is formed of metallic foil bent in the molding material of the package and exposed to the outside of the package.

A stacked semiconductor device, as described in Japanese Patent Laid-Open No. 198148/1990, in which a plurality of semiconductor devices that have been thinned under the TAB are stacked and are electrically connected by a layer-to-layer junction layer fitted to each outer frame.

SUMMARY OF THE INVENTION

Notwithstanding, the present inventors have examined the conventional semiconductor devices stated above: namely the semiconductor device of LOC construction, the semiconductor device under the TAB method, the thin semiconductor device and the stacked semiconductor device only to find out the following problems.

In the case of the conventional semiconductor device of LOC construction, the semiconductor chip that can be accommodated is small in size relative to given package exterior dimensions as it is resin-molded by transfer molding and is reducible in thickness to about 1 mm at the utmost. In addition, the semiconductor device shows poor dissipation of the heat generated within the semiconductor chip.

The conventional TAB method is characterized in that the external terminals (electrodes) of the semiconductor chip are restrictive and therefore costly.

Moreover, mechanical strength is poor because the inner leads are indirectly secured to the semiconductor chip and therefore unable to ensure reliability against thermal stress deriving from temperature stress.

In addition, as the lead is formed by etching a polyimide film, production cost is on the increase.

In the case of the conventional thin semiconductor device as described in Japanese Patent Laid-Open No. 186390/1989, the presence of molded resin on the principal surface of the semiconductor chip having circuits thereon makes it impossible to provide a modular laminated semiconductor device by stacking a plurality of semiconductor devices.

Moreover, the semiconductor device shows poor dissipation of the heat generated within the semiconductor chip as only the rear surface thereof is exposed.

As for the conventional stacked semiconductor device, an outer frame for supporting the lamination is required to compensate for insufficient strength as the lead is secured with only a bump electrode.

Moreover, a packaging area is increased by the outer frame for the lamination.

In addition, heat dissipation is retarded because of the outer frame.

A general object of the present invention is to provide the practicable art of obtaining an extra-thin package capable of accommodating a large-sized semiconductor chip.

A more specific object of the present invention is to provide the practicable art of dissipating the heat generated in a semiconductor chip.

Another object of the present invention is to provide a semiconductor device whose packaging area is substantially equal to that of a semiconductor chip.

Still another object of the present invention is to provide a small-sized extra-thin semiconductor device such that a plurality of semiconductor devices can be stacked and readily fabricated into a module.

A further object of the present invention is to provide a laminated semiconductor device in which a plurality of semiconductor devices are stacked and made into a module.

A still further object of the present invention is to provide a small-sized extra-thin semiconductor device capable of easing thermal stress deriving from temperature stress in such a state that a package has been secured to a board with solder.

The above and other objects and novel features of the present invention will be apparent from the following description taken in connection with the accompanying drawings.

The representative features of the present invention is briefly summarized as follows:

(1) A semiconductor device wherein leads and external terminals of a semiconductor chip are electrically connected and resin-molded on the principal surface of the semiconductor chip having circuits thereon is characterized in that the leads are bonded via an insulating adhesive layer to the principal surface of the semiconductor chip having circuits thereon, and that the lead extending from the principal surface of the semiconductor chip having circuits thereon up to the rear surface of the semiconductor chip is bonded via an insulating adhesive layer to the rear surface thereof.

(2) A semiconductor device wherein leads and external terminals of a semiconductor chip are electrically connected and molded by a molding means (resin) on the principal surface of the semiconductor chip having circuits thereon is characterized in that the leads are bonded via an insulating adhesive layer to the principal surface of the semiconductor chip having circuits thereon, only part of the principal surface of the semiconductor chip having circuits thereon being molded by the molding means (resin), and that the lead extending from the principal surface of the semiconductor chip having circuits thereon up to the rear surface of the semiconductor chip is bonded via an insulating adhesive layer to the rear surface thereof.

(3) The lead and the external terminal of the semiconductor chip are electrically connected by a metal wire, a metal bump or a metal ball.

(4) A laminated semiconductor device having a plurality of semiconductor devices that are stacked up is characterized by a means for selecting each of the semiconductor devices.

(5) A semiconductor device wherein leads and external terminals of a semiconductor chip are electrically connected and resin-molded on the principal surface of the semiconductor chip having circuits thereon is characterized in that the leads are bonded via an insulating adhesive layer to the principal surface of the semiconductor chip having circuits thereon, and that the principal surface of the semiconductor chip having circuits thereon or the principal surface and the side portions thereof are resin-molded.

(6) The outer lead portion of the leads are shaped so as to be fit for making a package thin-gage with flat packaging.

(7) The outer lead described in (5) is shaped so as to ease thermal stress.

(8) The leads and the external terminals of the semiconductor chip are electrically connected by metal wires, metal bumps or metal balls.

As only part of the principal surface of the semiconductor chip having circuits thereon is resin-molded according to the means (1) and (2) described above, the package can be made substantially equal in dimensions to the semiconductor chip.

As the principal surface of the semiconductor chip having circuits thereon, excluding part of that surface, is exposed, heat dissipation efficiency can be improved.

As the lead is secured via the insulating adhesive layer to the principal surface of the semiconductor chip having circuits thereon, the leads are resistant to mechanical stress deriving from heat because of the difference in thermal expansion coefficient between a wiring board and the semiconductor chip, and mechanical stress at the time the lead is shaped (bent) when the leads are mounted on the wiring board.

As the leads on the principal surface of the semiconductor chip having circuits thereon are exposed, moreover, a plurality of semiconductor devices may easily by stacked into a modular semiconductor device by providing a means for selecting each of them.

As the adherend surface of each outer lead thus bent toward the rear surface of the semiconductor chip is arranged on the substantially same plane, not only the mounting yield of joining with solder but also electrical reliability when the semiconductor device is joined to the wiring board with solder can be improved.

As the leads and the external terminals of the semiconductor chip are electrically connected by metal wires, metal bumps or metal balls according to the means (3) described above, ordinary leadframes made by pressing or etching are usable, whereby production cost can be reduced.

As the plurality of semiconductor devices are stacked up into the stacked semiconductor device equipped with the means for selecting each of them according to the means (4) described above, packaging density can be improved.

As only the principal surface or the principal surface and side portions of the semiconductor chip are resin-molded according to the means (5) described above, the package can be made substantially equal in dimensions to the semiconductor chip. As the principal surface and the opposite portion of the semiconductor chip are exposed, heat dissipation efficiency can be improved. As the lead is secured via the insulating adhesive layer to the principal surface of the semiconductor chip having circuits thereon according to the means (5) described above, the lead exhibits great mechanical strength and ensures reliability against mechanical and thermal stress.

The outer lead portion of the leads are shaped so as to be fit for making a package thin-gage with flat packaging according to the means (6), an extra-thin package can be made available.

As the outer leads of the leads are so shaped as to ease thermal stress according to the means (7), the thermal stress can be eased when the semiconductor device is packaged with solder on the board and thermal stress deriving from temperature stress can also be eased in such a state that the semiconductor device has been packaged on the board.

As the leads and the external terminals of the semiconductor chip are electrically connected by the wires and the metal balls according to the means (8), ordinary leadframes made by pressing or etching are usable with the effect of reducing production cost.

BRIEF DESCRIPTION OF THE DRAWINGS

FIG. 4 illustrates a layout of a semiconductor chip embodying the present invention.

DESCRIPTION OF THE PREFERRED EMBODIMENTS

Figure 1:
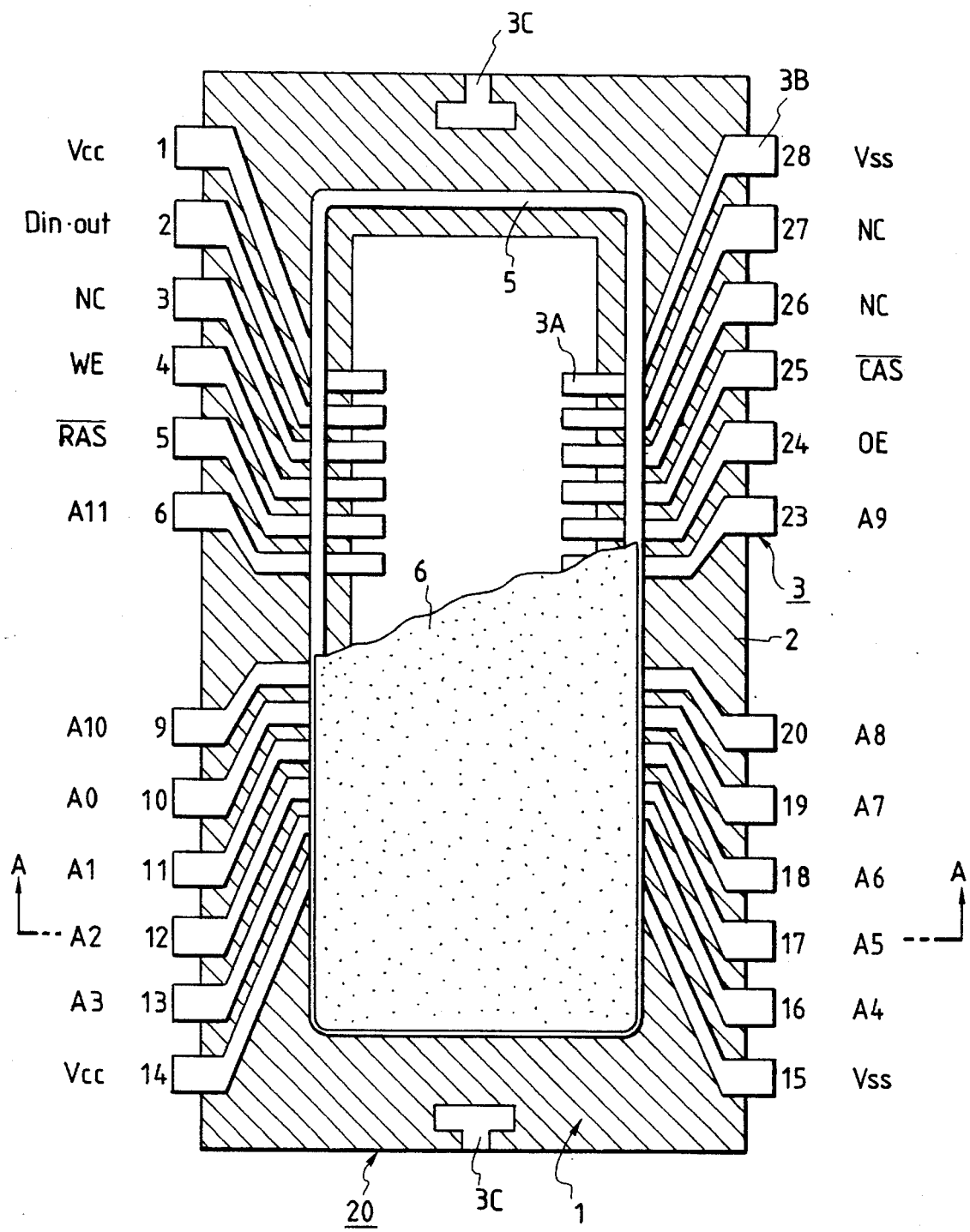
FIG. 1 is a partial cutaway plan view of a small-sized resin-molded semiconductor device as an embodiment 1 of the present invention, illustrating its overall construction.

Specific embodiments of the present invention will subsequently be described with reference to the accompanying drawings.

In all of the drawings used for illustrating the embodiments, like reference characters designate like or functionally corresponding parts with the omission of repetitive description of them.

[Embodiment 1]

FIG. 1 is a partial cutaway plan view of a small-sized resin-molded semiconductor device as an embodiment 1 of the present invention, illustrating its overall construction.

Figure 2:
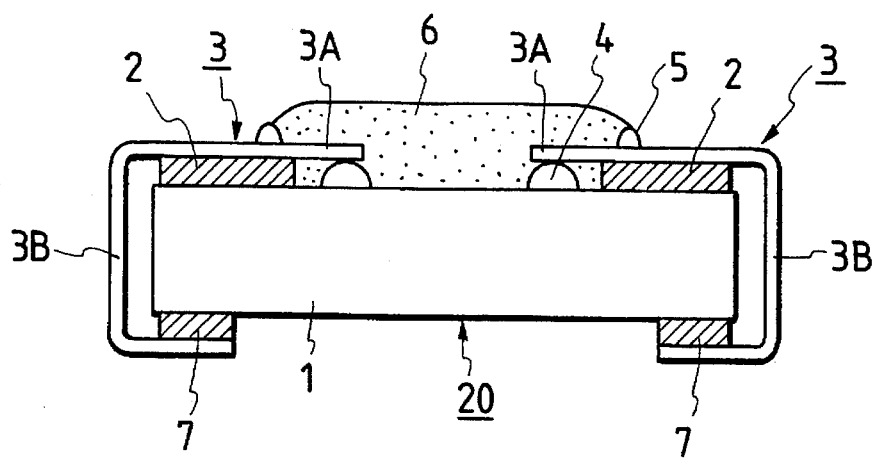
FIG. 2 is a sectional view of the principal part taken on line A—A of FIG. 1.

FIG. 2 is a sectional view of the principal part taken on line A—A of FIG. 1.

As shown in FIGS. 1 and 2, a small-sized resin-molded semiconductor device 20 is so constructed that leads 3 are secured via an insulating adhesive film (tape) 2 to the principal surface of a semiconductor chip 1 having circuits thereon, an inner lead 3A of each lead 3 and the external terminal (aluminum electrode) of the semiconductor chip 1 being electrically connected by means of a soldered bump electrode 4. A anti-resin-sagging member 5 is provided on the principal surface of the semiconductor chip 1 having circuits thereon in such a way as to surround the portion where the inner leads 3A of the leads 3 and the external terminals (aluminum electrodes) of the semiconductor chip 1 are electrically connected by means of the soldered bump electrodes 4, respectively. Liquid epoxy resin 6 or the like is injected by potting inside the anti-resin-sagging member 5 to mold the inside portion in resin. As shown in FIG. 2, an outer lead 3B of each lead 3 is bent and extended from the principal surface of the semiconductor chip 1 having circuits thereon up to the rear surface of the semiconductor chip 1 and secured via an insulating adhesive film 7 to the rear surface thereof.

In the resin-molded semiconductor device 20, as shown in FIG. 1, first, second ... 14th terminals (without seventh and eighth terminals) are arranged consecutively from top to bottom on the left, whereas 15th, 16th ... 28th terminals (without 21st and 22nd terminals) are arranged consecutively from bottom to top on the right. In other words, there are provided 24 terminals (24 pins) in total.

Control system signals, address system signals, data system signals, and power, for instance, are applied to the respective outer leads 3. As the control system signals, there are a low address strobe signal $\overline{RAS}$, a column address strobe signal $\overline{CAS}$, a write enable signal WE and the like. As for the data system signals, there are a data output signal Dout, and a data input signal Din. The power includes a reference power supply voltage Vss, e.g., the grounding potential 0 [V] of the circuit, and an operating power supply voltage Vcc, e.g., the operating voltage 5 [V] of the circuit.

Figure 3:
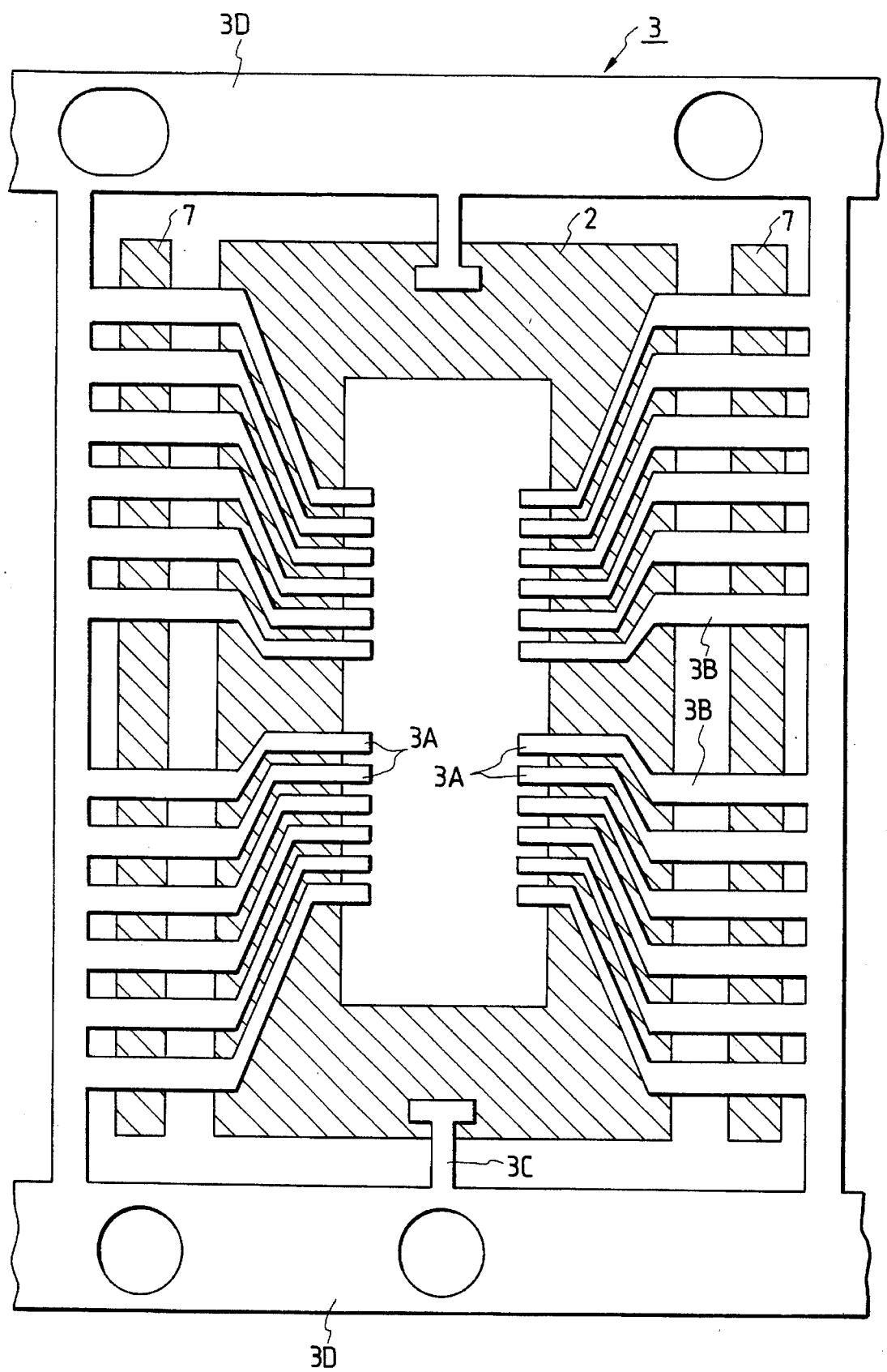
FIG. 3 is a plan view of a leadframe in a embodiment 1, illustrating its configuration.

A leadframe for the overall leads 3 comprises, as shown in FIG. 3, 24 pieces of inner leads 3A, 24 pieces of outer leads 3B, semiconductor-chip suspending leads 3C, and outer frames 3D for supporting the leads 3, these being integrally formed. Moreover, the insulating adhesive films 2, 7 are bonded to the leadframe in position. The lead 3 is in the form of a sheet or foil of Fe (42 Ni—Fe material) or Cu and its surface may be plated with Ag, Au or the like if necessary for bonding, soldering or the like.

The semiconductor chip (pellet) 1 is formed of a flat rectangular, monocrystalline silicon substrate and the principal surface of the semiconductor chip 1 having circuits thereon (the surface face to the inner leads 3A) is loaded with a DRAM having a capacity as large as 16 [Mbits]. As shown in FIG. 4 (a chip layout), a memory cell array MARY is so arranged as to cover almost the whole principal surface of the semiconductor chip 1 having circuits thereon. The memory cell array MARY shown in FIG. 4 is subdivided into 64 elements. Each element resulting from the subdivision of the memory cell array MARY has a capacity of 256 [Kbits]. The memory cell array MARY thus subdivided into 64 elements has one block every 16 elements, four blocks in total, with 16 elements in the upper left section, 16 elements in the upper right section, 16 elements in the lower left section, and 16 elements in the lower right section as one block, respectively.

A sense amplifier circuit SA is arranged between two elements of the memory cell array MARY thus subdivided into 64 elements. Moreover, a low address decoder circuit XDEC and a word driver circuit WD as direct system peripheral circuits are arranged on the respective central sides of the two opposing elements of the memory cell array MARY thus subdivided into 64 elements of the semiconductor chip 1.

Column address decoder circuits YDECs as direct system peripheral circuits and a peripheral circuit MC are arranged between the upper left and the lower left block out of the four blocks described above, whereas column address decoder circuits YDECs and a peripheral circuit MC are arranged between the upper right and the lower right block. Since the peripheral circuit MC is an indirect system peripheral circuit, a $\overline{RAS}$ system circuit, a $\overline{CAS}$ system circuit, an address buffer circuit, a power supply limiter circuit and the like are arranged therein. Each of the direct and indirect system peripheral circuits described above is basically arranged by combining a complementary MISFET with a bipolar transistor.

There are also arranged a plurality of external terminals (bonding pads) BP between the upper left and the upper right block and between the lower left and the lower right block, respectively. In other words, the plurality of external terminals BP are, as shown in FIG. 4, arranged in the central part of the rectangular semiconductor chip 1 in its longitudinal (from top to bottom) direction.

A plurality of memory cells, each holding 1-bit data, are lined up in each one of 64 elements of the memory cell array thus subdivided. The memory cell is composed of a series circuit including a memory cell selection MISFET and a data-storage capacity element.

Figure 5:
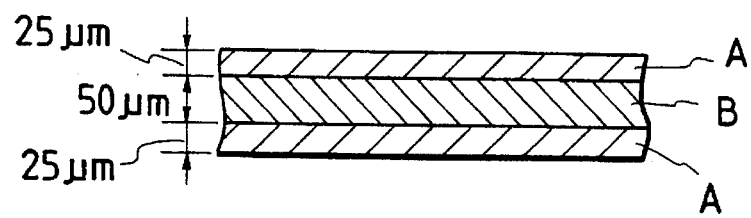
FIG. 5 is a sectional view of an insulating adhesive film embodying the present invention, illustrating its construction.

The insulating adhesive films (tapes) 2, 7 are in the form of a tape having a thermosetting or thermoplastic single layer (an adhesive material only), or a double adhesive layer (not less than three layer construction). In the case of a three-layer insulating adhesive film 27 shown in FIG. 5, for instance, it is multilayer in construction, having a base B interposed between adhesive layers A, and composed of, e.g., polyetheramideimide 25 μm/captone 50 μm/polyetheramideimide 25 μm. In this case, any other polyimide film may replace the captone.

Figure 6:
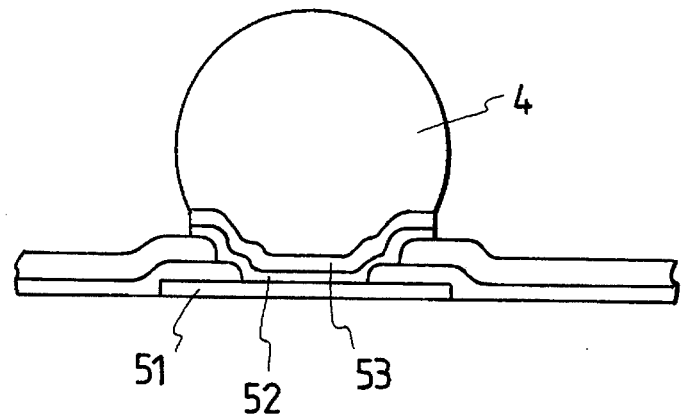
FIG. 6 is a sectional view of a soldered bump electrode embodying the present invention, illustrating its construction.

As shown in FIG. 6, moreover, the soldered bump electrode 4 is made through the steps of forming a double barrier metal layer 52 of Cu/Ti on an Al electrode (pad) 51 on the principal surface of the semiconductor chip 1 having circuits thereon, forming an Ni layer 53 thereon, and further forming the soldered bump (Pb/Sn) 4 on the combination above.

The semiconductor chip 1 is, e.g., 0.2–0.5 mm thick; the liquid resin 6, e.g., 0.25–0.6 mm thick; the lead 3, e.g., 0.1–0.25 mm thick; and the insulating film (base) of the insulating adhesive film 2, e.g., 25–125 μm thick and the adhesive layer thereof, e.g., 10–30 μm thick.

In this embodiment 1, for instance, the semiconductor chip 1 is 0.3 mm thick; the liquid resin 6 above the lead 3, 0.1 mm high; the lead 3, 0.1 mm thick; and the insulating adhesive film 2, 0.05 mm thick. The semiconductor device is 0.7 mm thick in total. When the components above are stacked, the effective height of the semiconductor device excluding its uppermost layer becomes 0.6 mm.

A description will briefly be given of a method of assembling the embodiment 1.

Figure 7A:
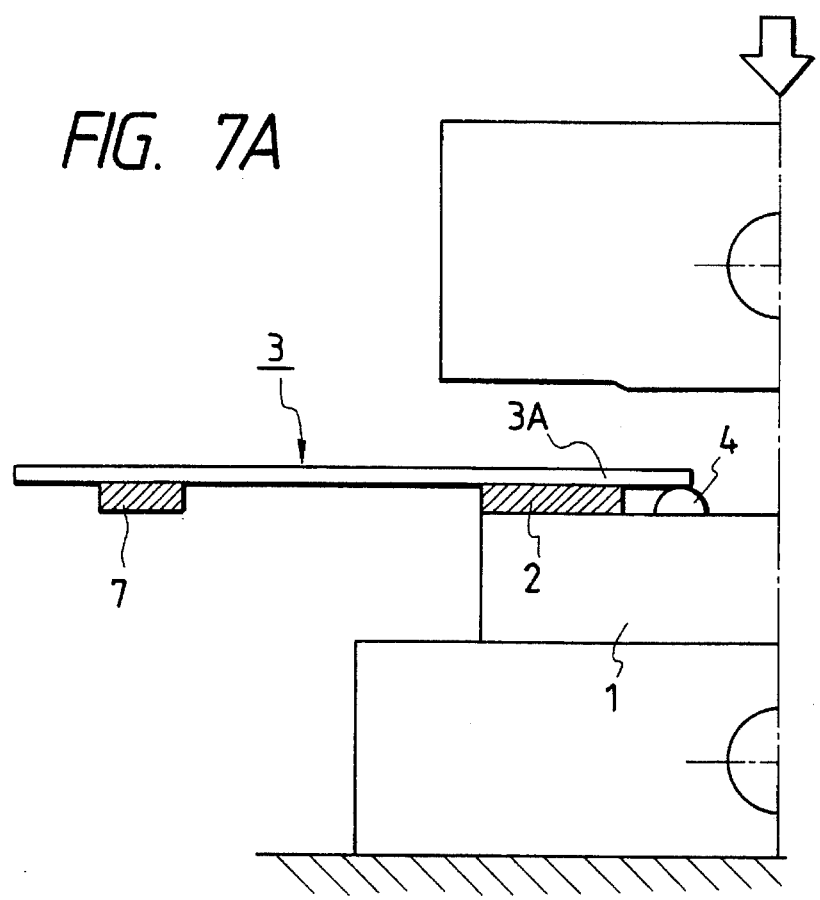
FIGS. 7A and 7B are diagrams illustrating an assembly method embodying the present invention.

As shown in FIG. 7A, the leadframe with the insulating adhesive film (tape) 2 is placed on the principal surface of the semiconductor chip 1 having circuits thereon with the soldered bump electrode 4 and compression-bonded by a heating block so that the insulating adhesive film (tape) 2 is bonded onto the principal surface of the semiconductor chip 1 having circuits thereon. Simultaneously, the inner lead 3A of the lead 3 is coupled to the soldered bump electrode 4 of the semiconductor chip 1.

Figure 7B:
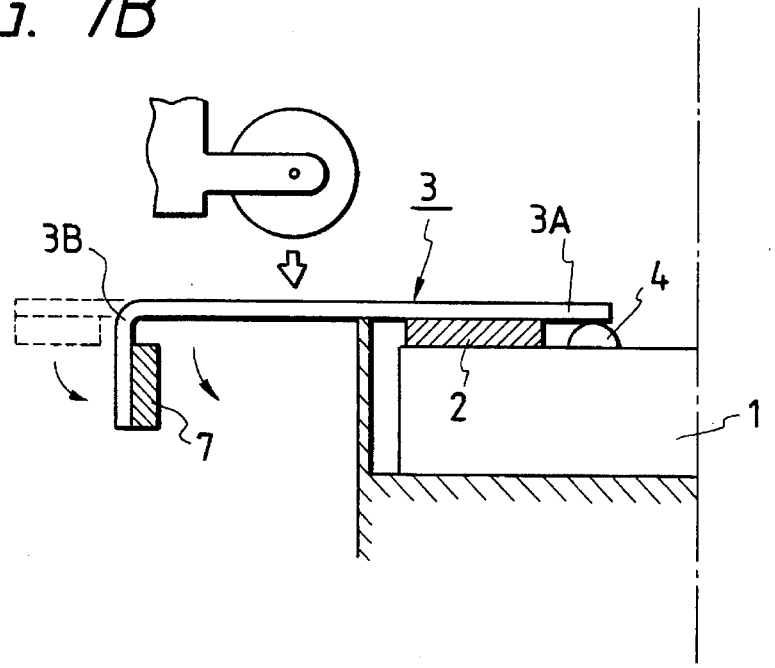

As shown in FIG. 7B, the end of the outer lead 3B of the lead 3 is first bent and then bent by a roller or the like in parallel to the side of the semiconductor chip 1 to have the insulating adhesive film (tape) 7 ultimately thermocompression-bonded to the rear surface of the semiconductor chip 1.

The anti-resin-sagging member 5 is then formed on the principal surface of the semiconductor chip 1 having circuits thereon and by dripping (potting) the liquid resin 6, which is then hardened, the interior thereof is completely molded.

As sealing resin 6 is absent on the rear surface of the semiconductor chip 1 thus constructed, the package can be made as thin as about 0.6 mm.

As the principal surface of the semiconductor chip 1 having circuits thereon excluding part of it, is exposed, heat dissipation efficiency can be improved.

As the lead 3 is secured via the insulating adhesive films 2, 7 to the semiconductor chip 1, the connection between the semiconductor chip 1 and the lead 3 is prevented from peeling off or rupturing even when the lead 3 undergoes mechanical stress originating from heat because of the difference in thermal expansion coefficient between the monocrystalline silicon semiconductor chip 1 and the wiring board such as printed circuit board. In addition, the construction described above is effective in making the lead withstand the mechanical stress when it is bent.

As the leads 3 are exposed even on the principal surface of the semiconductor chip 1 having circuits thereon, moreover, a plurality of such semiconductor devices may easily be stacked directly into a modular semiconductor device.

When the semiconductor device is bonded to the wiring board with solder, the adherend surface of each outer lead 3B thus bent toward the rear surface of the semiconductor chip is arranged on the substantially same plane in a position apart therefrom by the thickness of both the insulating adhesive film 7 and the outer lead 3B. As a result, the electrical reliability of the packaging adherend portion can be improved. Consequently, the yield of the packaged adherend portion is also improvable.

Figure 8:
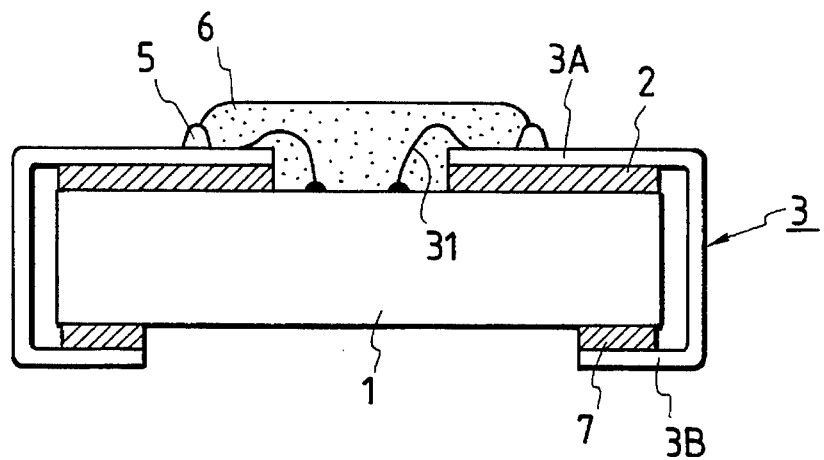
FIGS. 8, 9 and 10 illustrate a modified embodiment 1.
Figure 9:
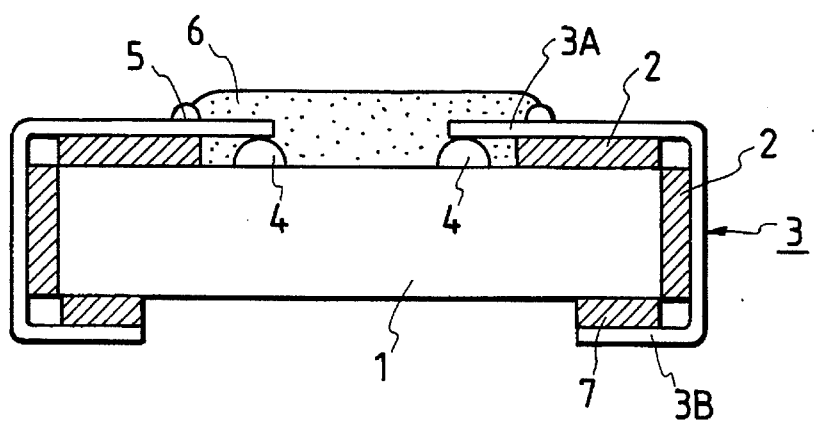
Figure 10:
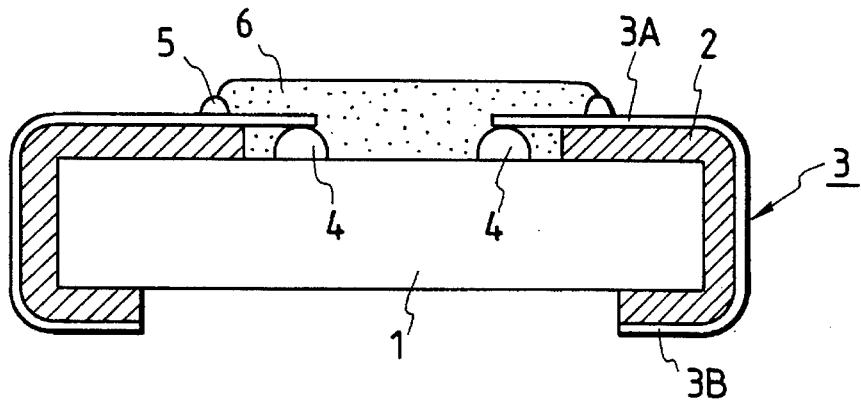

Although the leads 3 are secured via the insulating adhesive films 2, 7 to the semiconductor chip 1 in the embodiment 1 shown, it may be modified as shown in FIGS. 8, 9 and 10 by increasing the adherent areas or places of the insulating adhesive films 2, 7 to prevent the deformation and the poor insulation of the lead 3. As shown in FIG. 8, the inner lead 3A and the external terminal of the semiconductor chip 1 are connected by a bonding wire 31 of Au or Al. In other words, it is only necessary for the inner lead 3A and the external terminal of the semiconductor chip 1 to be electrically connected by any other means. The liquid resin 6 is not always required in the embodiment 1 and the modified one.

A method of producing the anti-resin-sagging member 5 will subsequently be described.

Figure 11:
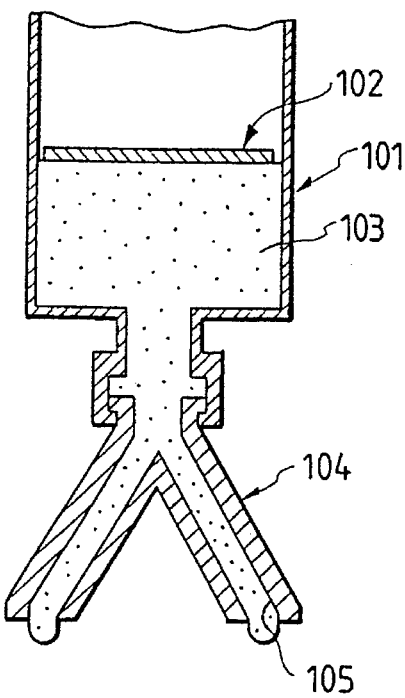
FIG. 11 is a sectional view of an apparatus for producing an anti-resin-sagging member.
Figure 12:
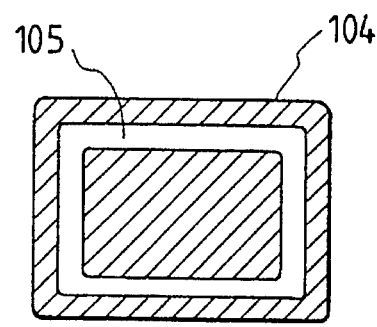
FIG. 12 is a diagram illustrating the profile of the supply nozzle of FIG. 11.

FIG. 11 is a sectional view of an apparatus for producing the anti-resin-sagging member 5, wherein 101 refers to a syringe, 102 to a plastic plate, 103 to an anti-resin-sagging material, and 104 to an anti-resin-sagging material supply nozzle. A supply port 105 of the supply nozzle 104 is formed into a rectangular ring.

Figure 13A:
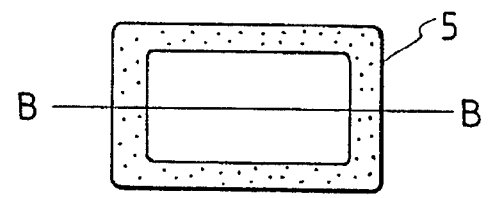
FIG. 13 is a diagram illustrating the profile of the anti-resin-sagging member in the embodiment 1.
Figure 13B:

The anti-resin-sagging member 5 in the form of a rectangular frame is configured as shown in FIG. 13 (a represents its plan view and b its sectional view taken on line B—B).

The anti-resin-sagging member 5 in the form of the rectangular frame is bonded onto the principal surface of the semiconductor chip 1 having circuits thereon with an insulating adhesive.

Figure 14:
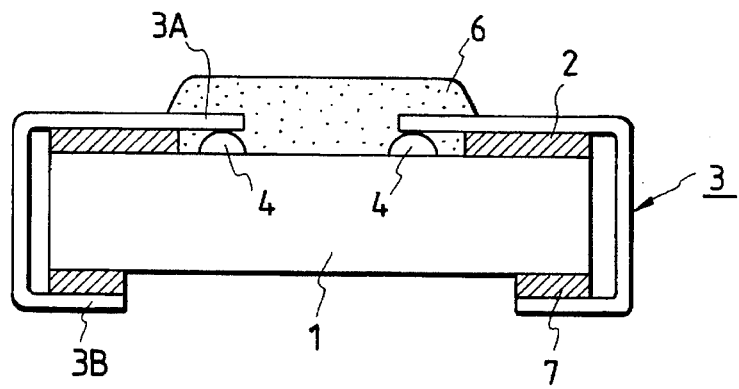
FIG. 14 illustrates a modified embodiment 1 reduced to a mold type without the provision of the anti-resin-sagging member.

Although resin-molding has been made by potting in the embodiment 1, it may be implemented by transfer molding without providing the anti-resin-sagging member 5 as shown in FIG. 14.

Figure 15:
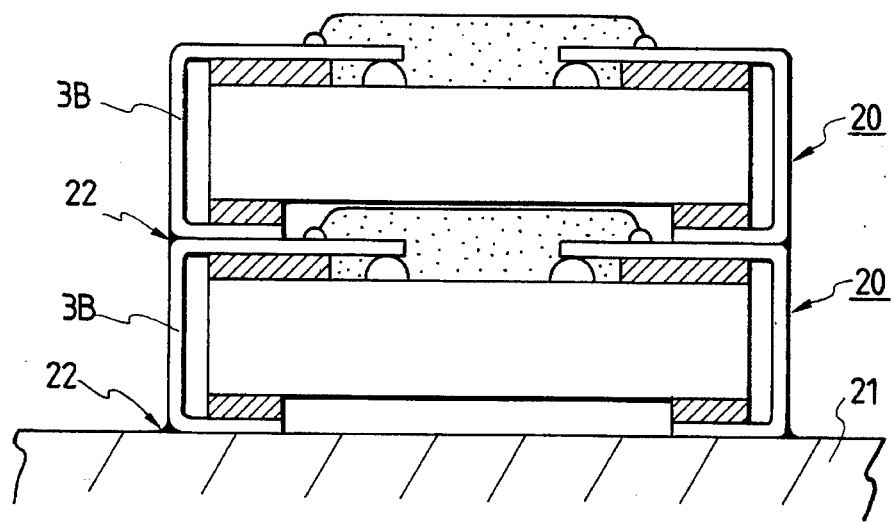
FIG. 15 illustrates a combination of two small-sized resin-molded semiconductor devices stacked on a wiring substrate in the embodiment 1.

FIG. 15 is a diagram of two small-sized resin-molded semiconductor devices 20 in the embodiment 1 joined with solder 22 and mounted on a wiring board 21. This stacked type will be described in detail later with reference to other embodiments.

[Embodiment 2]

Figure 16:
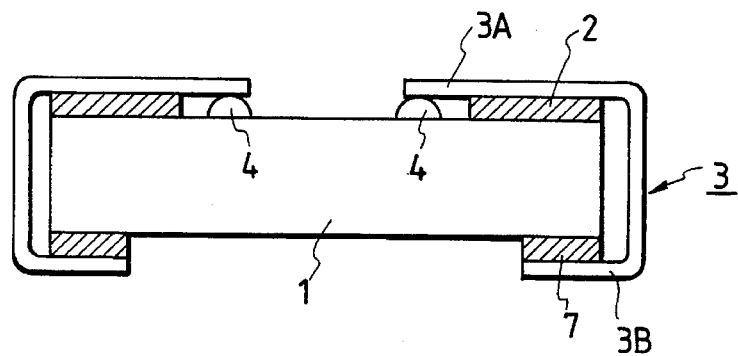
FIG. 16 is a sectional view of the principal part of an extra-thin resin-molded semiconductor device as an embodiment 2 of the present invention.

FIG. 16 is a sectional view of the principal part of an extra-thin resin-molded semiconductor device as an embodiment 2 of the present invention.

Figure 17:
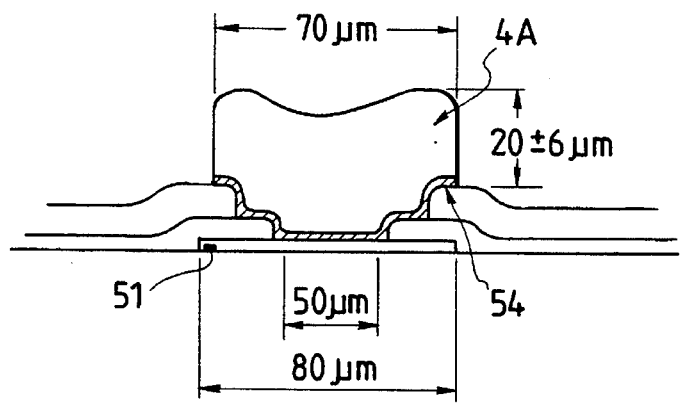
FIG. 17 is a sectional view of a gold bump electrode embodying the present invention, illustrating its construction.

In the extra-thin resin-molded semiconductor device in the embodiment 2, a gold (Au) ball (or a gold bump electrode) 4A is formed on an Al electrode (pad) 51 on the principal surface of the semiconductor chip 1 having circuits thereon as shown in FIG. 17 and the end of the tin(Sn)-plated inner lead 3A of the lead 3 is directly thermocompression-bonded to the gold (Au) ball (or the gold bump electrode) 4A, the lead 3 being bonded via the insulating adhesive film 2. The principal surface of the semiconductor chip 1 having circuits thereon is used in such a condition that it is not molded in liquid epoxy resin or the like.

The gold (Au) ball 4A is made by, for instance, bonding a gold (Au) wire by nail head bonding onto the Al electrode (pad) 51 and then removing the gold (Au) wire in a portion other than the ball.

The gold (Au) bump electrode 4A is made, as shown in FIG. 17, by forming a double barrier metal layer 54 of Pb/Ti, W/Ti, Pt/Ti or the like on the Al electrode (pad) 51 and forming a gold (Au) bump thereon.

As the sealing resin is absent on the principal surface of the semiconductor chip 1 having circuits thereon, this package can be made thinner than that in the embodiment 1.

As set forth above, the gold (Au) ball 4A is formed on the Al electrode 51 on the principal surface of the semiconductor chip 1 having circuits thereon and the end of the tin(Sn)-plated inner lead 3 is directly thermocompression-bonded to the gold (Au) ball 4A. Consequently, an extra-thin semiconductor device is obtainable.

[Embodiment 3]

Figure 18:
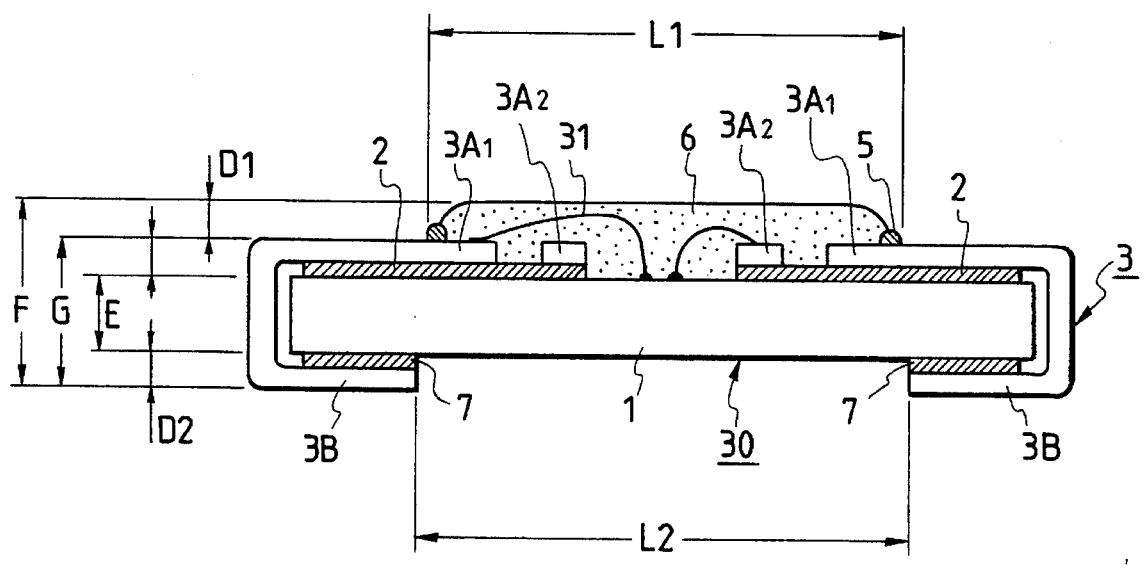
FIG. 18 is a sectional view of a resin-molded semiconductor device as an embodiment 3 of the present invention.

FIG. 18 is a sectional view of the principal part of a resin-molded semiconductor device as an embodiment 3 of the present invention.

Figure 19A:
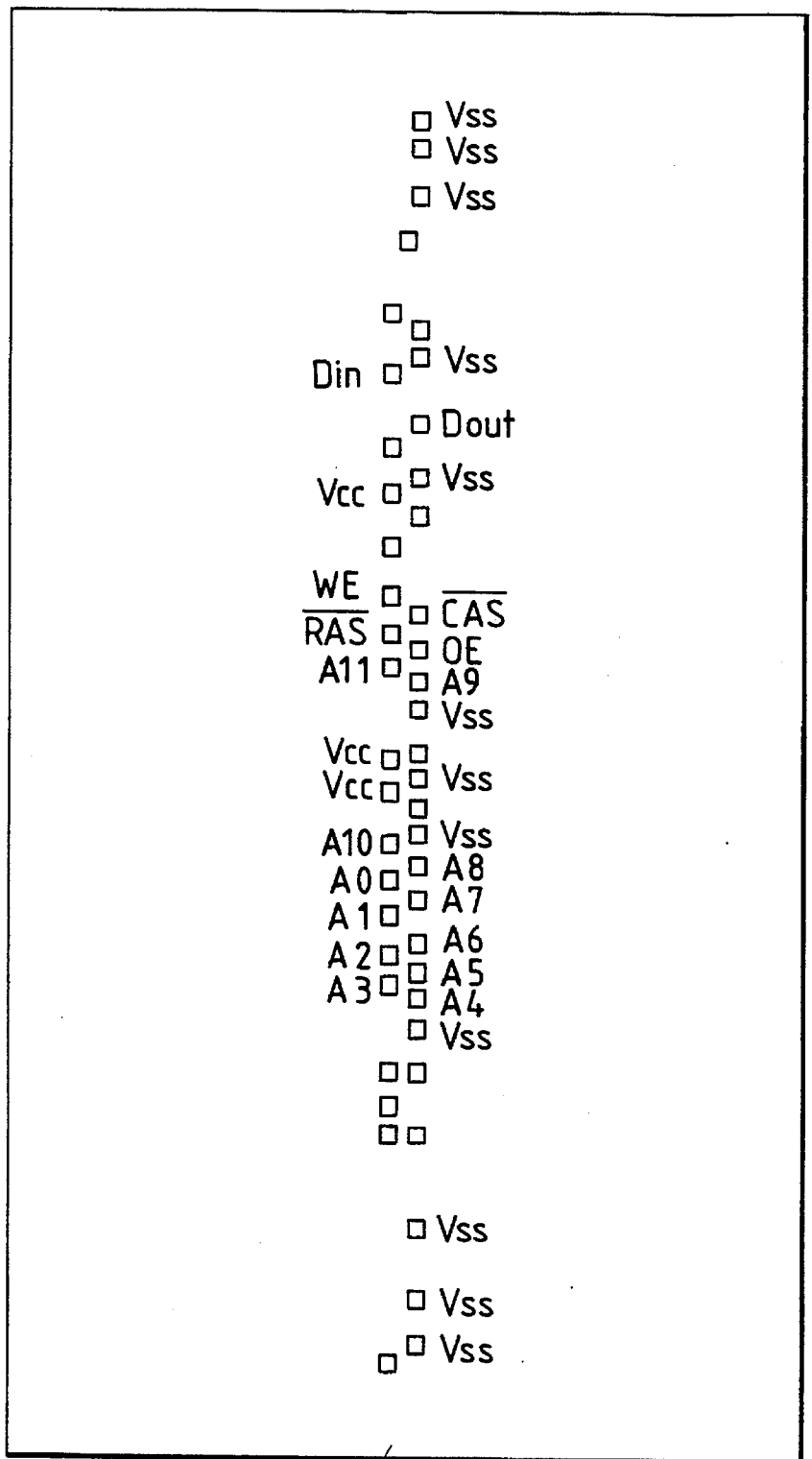
FIGS. 19A and 19B are plan views of external terminals (bonding pads) of the semiconductor chip arranged according to the embodiment 3, illustrating the positional relation between each external terminal and a lead pin.

FIG. 19A is a plan view of the semiconductor chip in the embodiment 3, illustrating an arrangement of its external terminals (bonding pads).

Figure 19B:
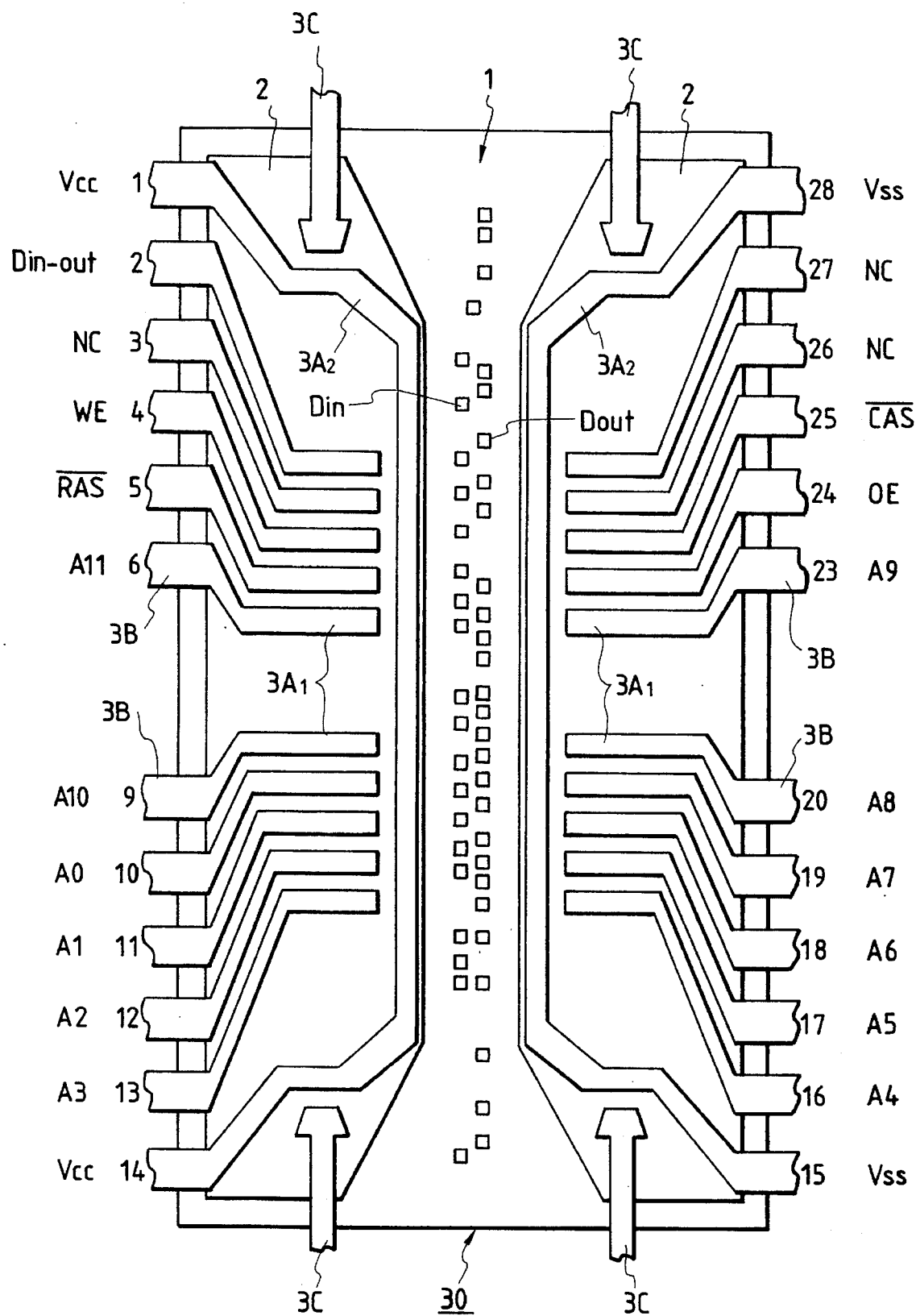

FIG. 19B is a diagram illustrating the positional relation between the external terminal and a lead pin.

Figure 20:
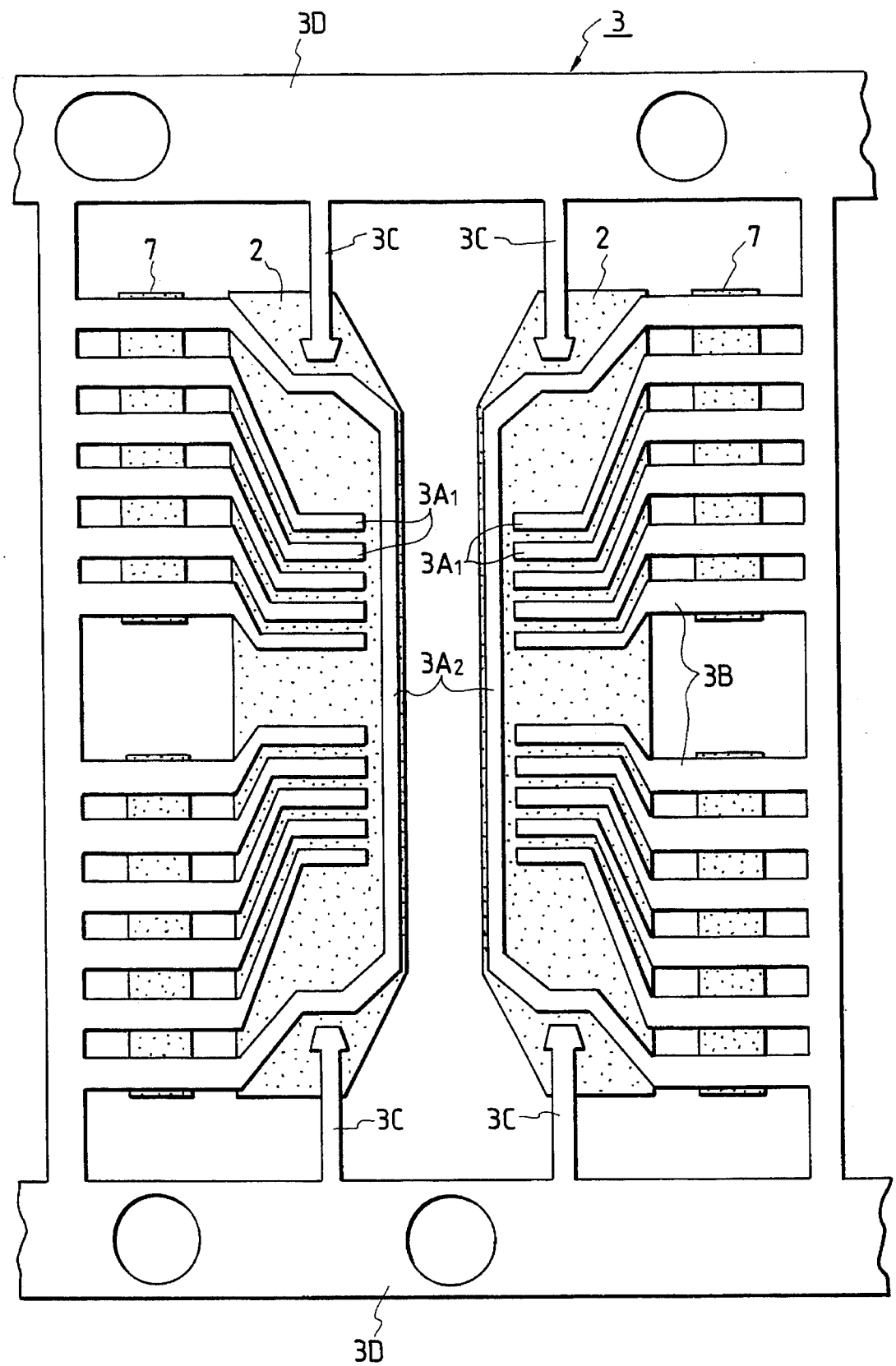
FIG. 20 is a plan view of the overall leadframe in the embodiment 3, illustrating its construction.

FIG. 20 is a diagram illustrating the overall construction of a leadframe in the embodiment 3.

In a small-sized resin-molded semiconductor device 30, as shown in FIGS. 18 to 20 inclusive, the lead 3 is bonded via the insulating adhesive film 2 to the principal surface of the semiconductor chip 1 having circuits thereon, and the inner lead 3A (consisting of an inner lead $3A_1$ for signal and an inner lead $3A_2$ for common use) of the lead 3 and the external terminal (bonding pad) of the semiconductor chip 1 are electrically connected by the bonding wire (Au wire) 31. The anti-resin-sagging member 5 is provided on the principal surface of the semiconductor chip 1 having circuits thereon in such a way as to surround a portion where the inner leads 3A of the leads 3 and the external terminals of the semiconductor chip 1 are electrically connected. The liquid epoxy resin 6 or the like is injected by potting inside the anti-resin-sagging member 5 to mold this portion in the liquid resin 6. The outer lead 3B of the lead 3 is bent and extended from the principal surface of the semiconductor chip 1 having circuits thereon up to the rear surface thereof where it is stuck via the insulating adhesive film 7.

In the package in the embodiment 3, the width dimension (distance) L2 between the portions of the outer leads 3B that have been bent toward the rear surface of the semiconductor chip 1 is set greater than the dimension L1 between the frames of the anti-resin-sagging member 5, whereas the dimension (depth) D2 of the portion bent from the rear surface of the semiconductor chip 1 toward the underside of the outer lead 3B up to its outer side face is also set greater than the height dimension D1 between the upper face of the outer lead 3B and the outer side face of the resin 6, the outer side face being remotest from the principal surface of the semiconductor chip 1 having circuits thereon.

As shown in FIG. 18, the dimensions, i.e., thickness of the respective portions are as follows, for instance: the semiconductor chip 1 is 0.3 mm thick (E); the lead 3, 0.2 mm thick; the insulating adhesive film 7, 0.1 mm thick; the portion bent from the rear surface of the semiconductor chip 1 toward the underside of the outer lead 3B up to its outer side face, 0.3 mm thick (deep D2); and the portion between the outer side face of the outer lead 3B on the principal surface of the semiconductor chip 1 having circuits thereon and the outer side face of the resin 6, 0.25 mm thick (D1). Consequently, the small-sized resin-molded semiconductor device 30 becomes 1.15 mm thick (F) and when these devices are stacked, its effective height (G) becomes 0.9 mm thick.

The semiconductor chip 1 is a 16 MDRAM, with a layout similar to what is shown in FIG. 4 (embodiment 1). FIG. 19A shows an arrangement of its external terminals (bonding pads). Moreover, FIG. 19B illustrates the positional relation between each external terminal and the corresponding lead pin.

In the resin-molded semiconductor device 30, as shown in FIG. 19B, first, second . . . 14th terminals (without seventh and eighth terminals) are arranged consecutively from top to bottom on the left, whereas 15th, 16th . . . 28th terminals (without 21st and 22nd terminals) are arranged consecutively from bottom to top on the right. In other words, there are provided 24 terminals (24-pins) in total.

Control system signals, address system signals, data system signals, and power, for instance, are applied to the respective outer leads 3B. As the control system signals, there are the low address strobe signal $\overline{RAS}$, the column address strobe signal $\overline{CAS}$, the write enable signal WE and the like. As for the data system signals, there are the data output signal Dout and the data input signal Din. The power is supplied as a reference power supply voltage Vss, e.g., the grounding potential 0 [V] of the circuit, and an operating power supply voltage Vcc, e.g., the operating voltage 5 [V] of the circuit.

The leadframe for all the leads 3 comprises, as shown in FIG. 20, 22 pieces of inner leads 3A, 24 pieces of outer leads 3B, semiconductor-chip suspension leads 3C, and outer frames 3D for supporting the leads 3, these being integrally formed. Moreover, insulating adhesive films 2, 7 are bonded to the leadframe in position. The inner lead 3A consists, as described above, of the inner lead $3A_1$ for signal and the inner lead $3A_2$ for common use. With this arrangement, the same effect is achieved as in the case of the embodiment 1.

[Embodiment 4]

Figure 21:
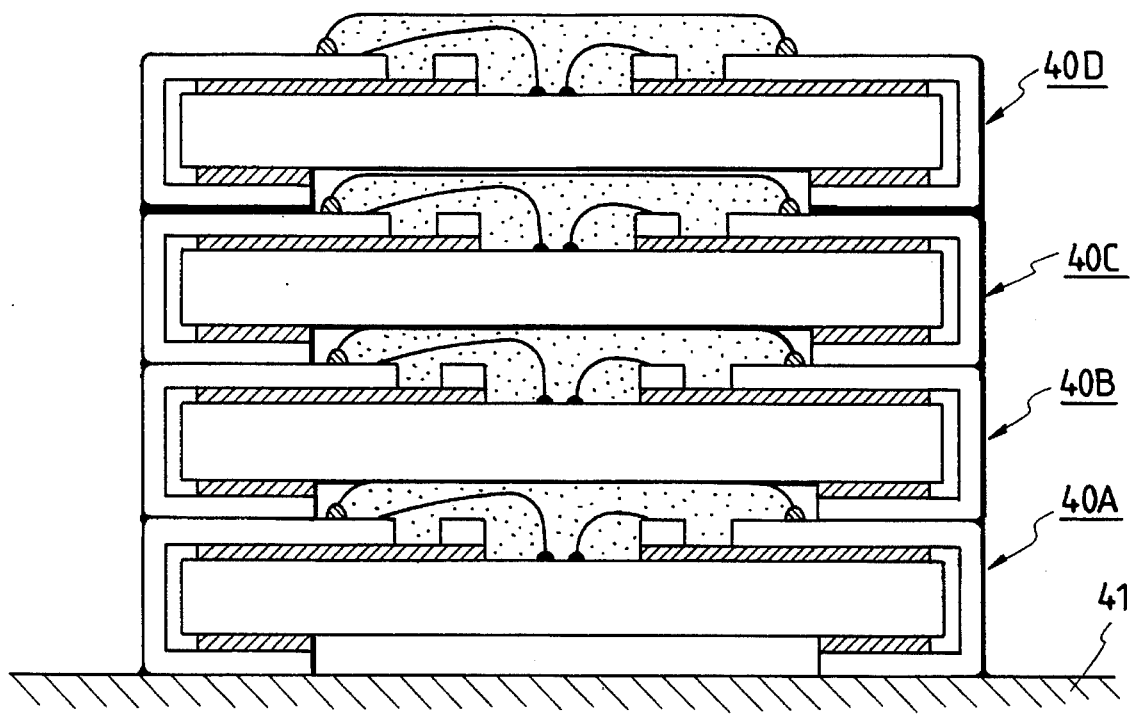
FIG. 21 is a sectional view of the principal part of a modular semiconductor device as an embodiment 4 of the present invention.

FIG. 21 is a sectional view of the principal part of a modular semiconductor device as an embodiment 4 of the present invention.

Figure 22:
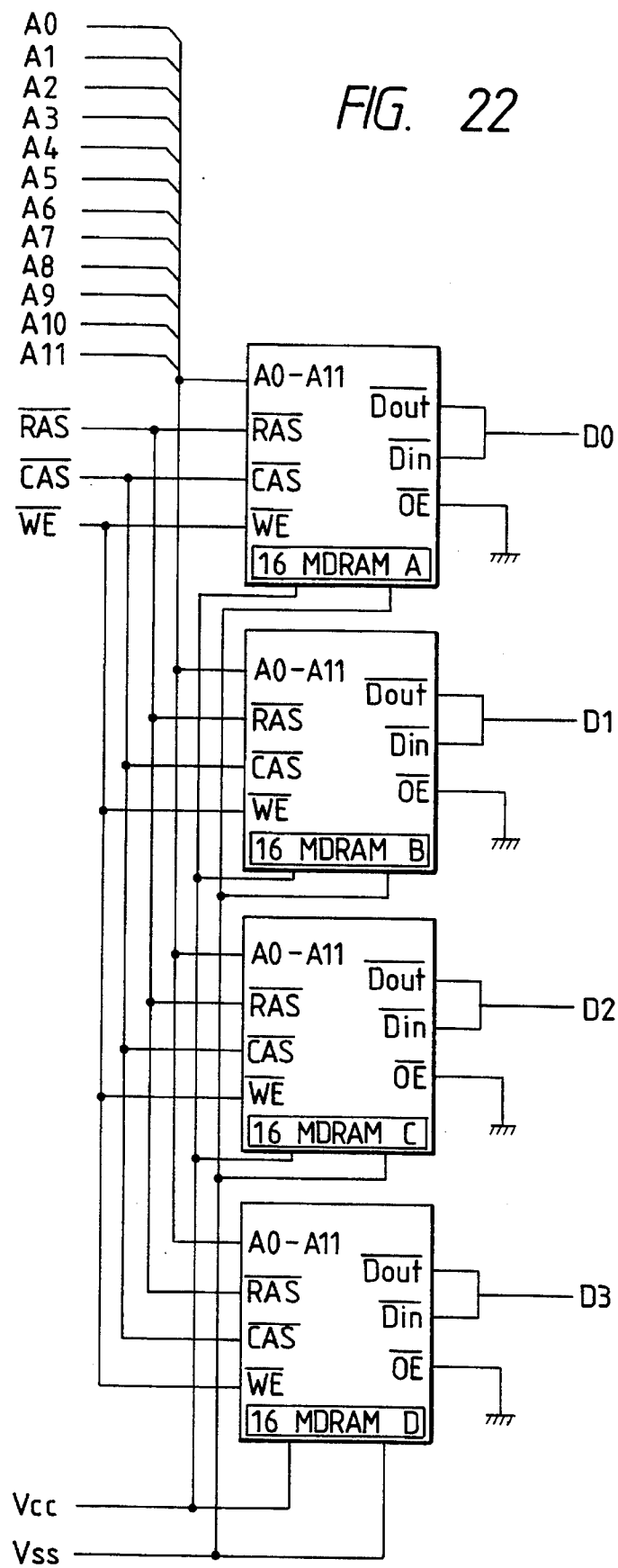
FIG. 22 is a circuit diagram illustrating a system configuration of the modular semiconductor device shown in FIG. 21.

FIG. 22 is a circuit diagram illustrating a system configuration of the modular semiconductor device shown in FIG. 21.

FIGS. 23 to 26 inclusive, are plan views of input/output terminals (bonding pads) Din, Dout of semiconductor devices and outer leads thereof to respectively show their connective relations.

In the modular semiconductor device in the embodiment 4, as shown in. FIG. 21, four of the 16 MDRAMs 40A, 40B, 40C, 40D in the embodiment 3 are stacked on a packaging board 41 (an example of 16 MDRAM×4 stacked package construction).

The modular DRAM system is provided with the circuit arrangement shown in FIG. 22.

More specifically, the low address strobe signal $\overline{RAS}$, the column address strobe signal $\overline{CAS}$, the write enable signal WE, the reference power supply voltage Vss, and the operation power supply voltage Vcc to be applied to the respective outer leads 3B of the four 16 MDRAMs 40A, 40B, 40C, 40D are arranged so that they are commonly fed into the corresponding outer leads 3B of the four 16 MDRAMs 40A, 40B, 40C, 40D.

Moreover, X, Y system signals are applied to the respective address A0—A11 pins of the 16 MDRAMs 40A, 40B, 40C, 40D in an address multiplex mode.

In the embodiment 4, as shown in FIG. 22, the terminals D0–D3 of the corresponding outer leads 3B and the respective input/output terminals (bonding pads) Din, Dout are connected by the bonding wires 31 to use the different leads (pins) of the laminated 16 MDRAMs 40A, 40B, 40C, 40D as the input/output terminals D0–D3 and simultaneously as selective terminals.

Figure 23:
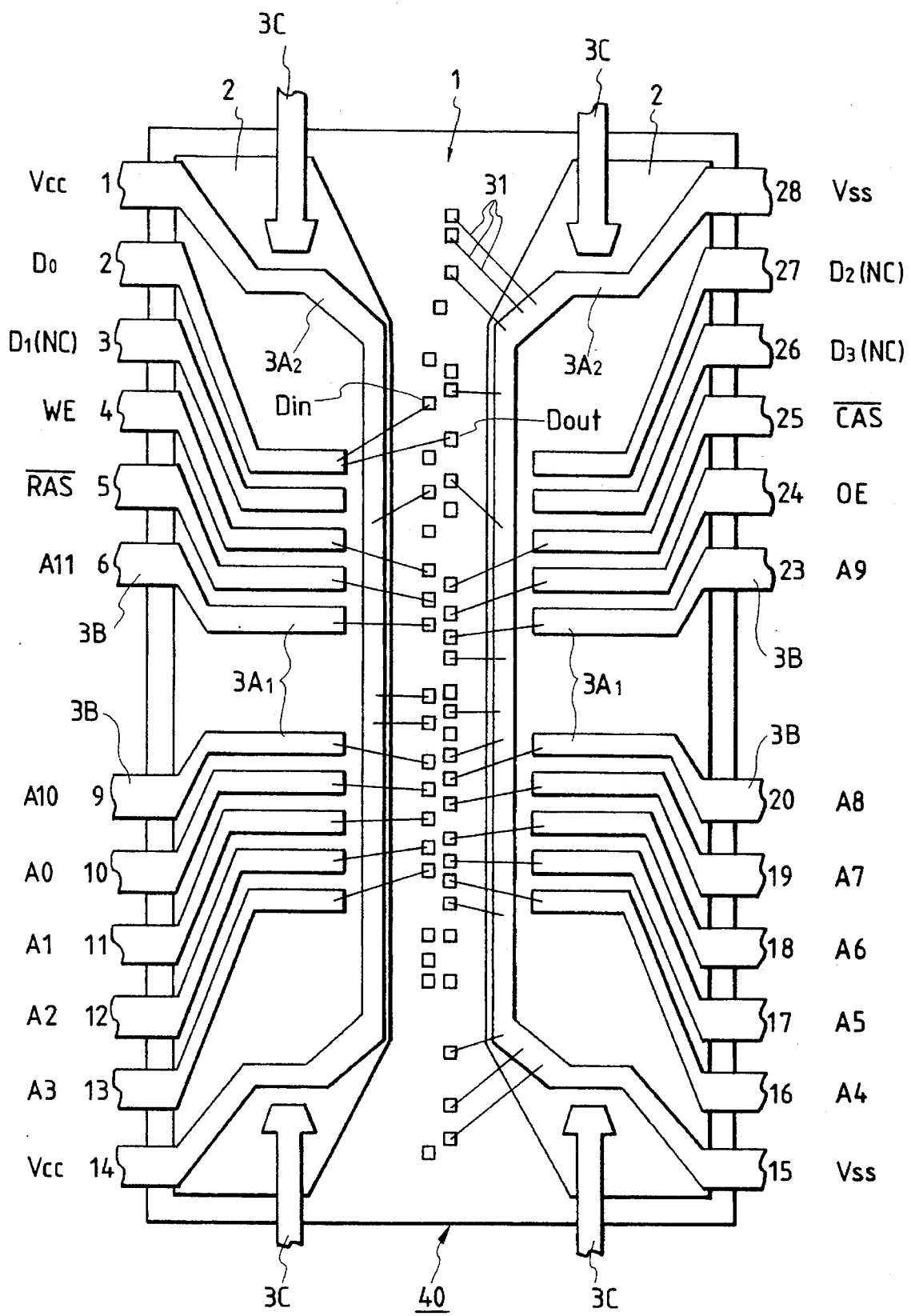
FIGS. 23 to 26 inclusive, are plan views of an input/output terminal of each semiconductor chip and the outer lead, illustrating their connective relation.
Figure 24:
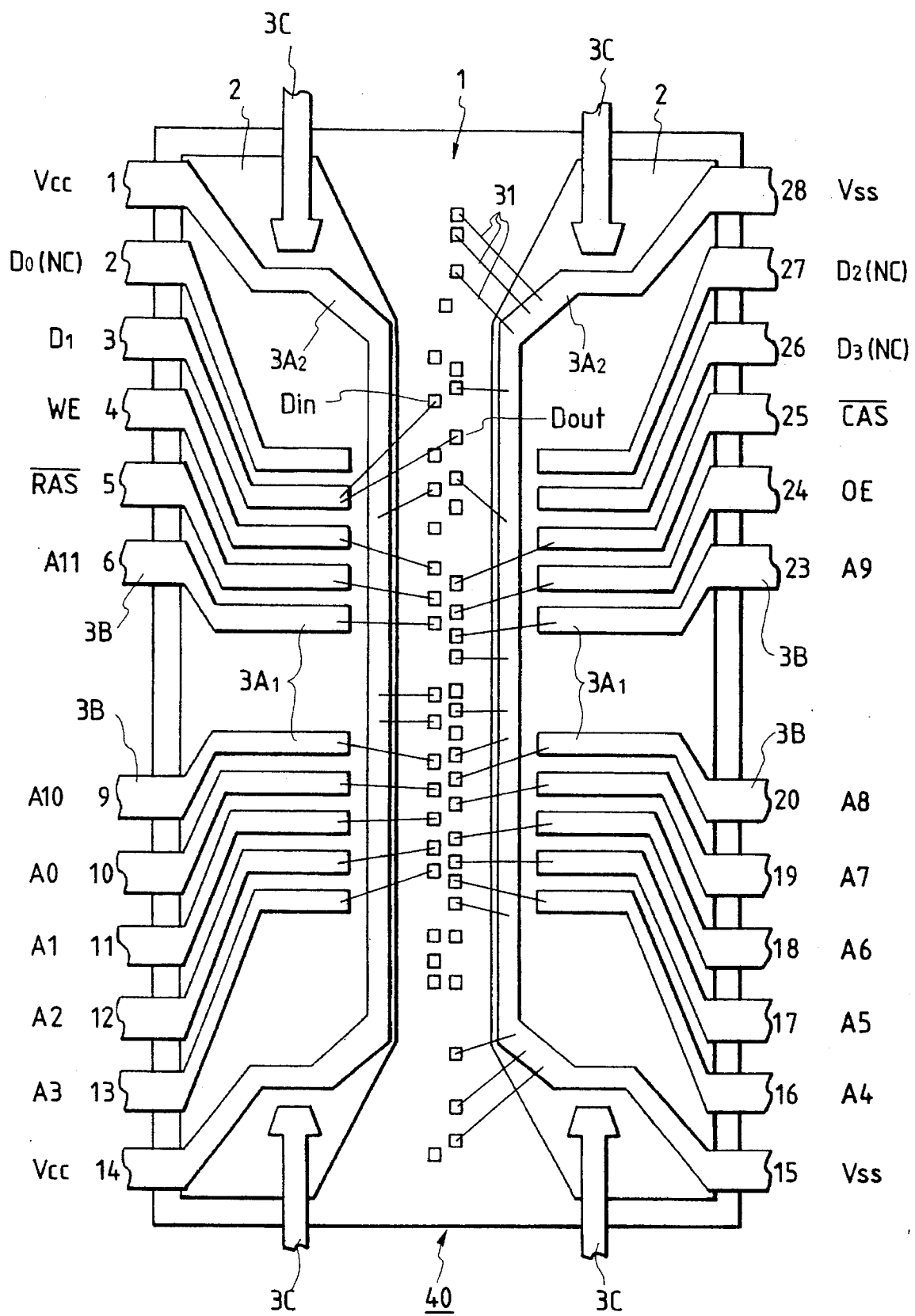

As shown in FIG. 23, the 16 MDRAM 40A is connected by bonding in such a way that its input/out terminals Din, Dout are, for instance, connected to the 2nd terminal D0 of the outer lead 3B by the bonding wire 31.

Similarly, the 16 MDRAM 40B is connected by bonding in such a way that its input/out terminals Din, Dout are connected to the 3rd terminal $D_1$ of the outer lead 3B by the bonding wire 31.

Figure 25:
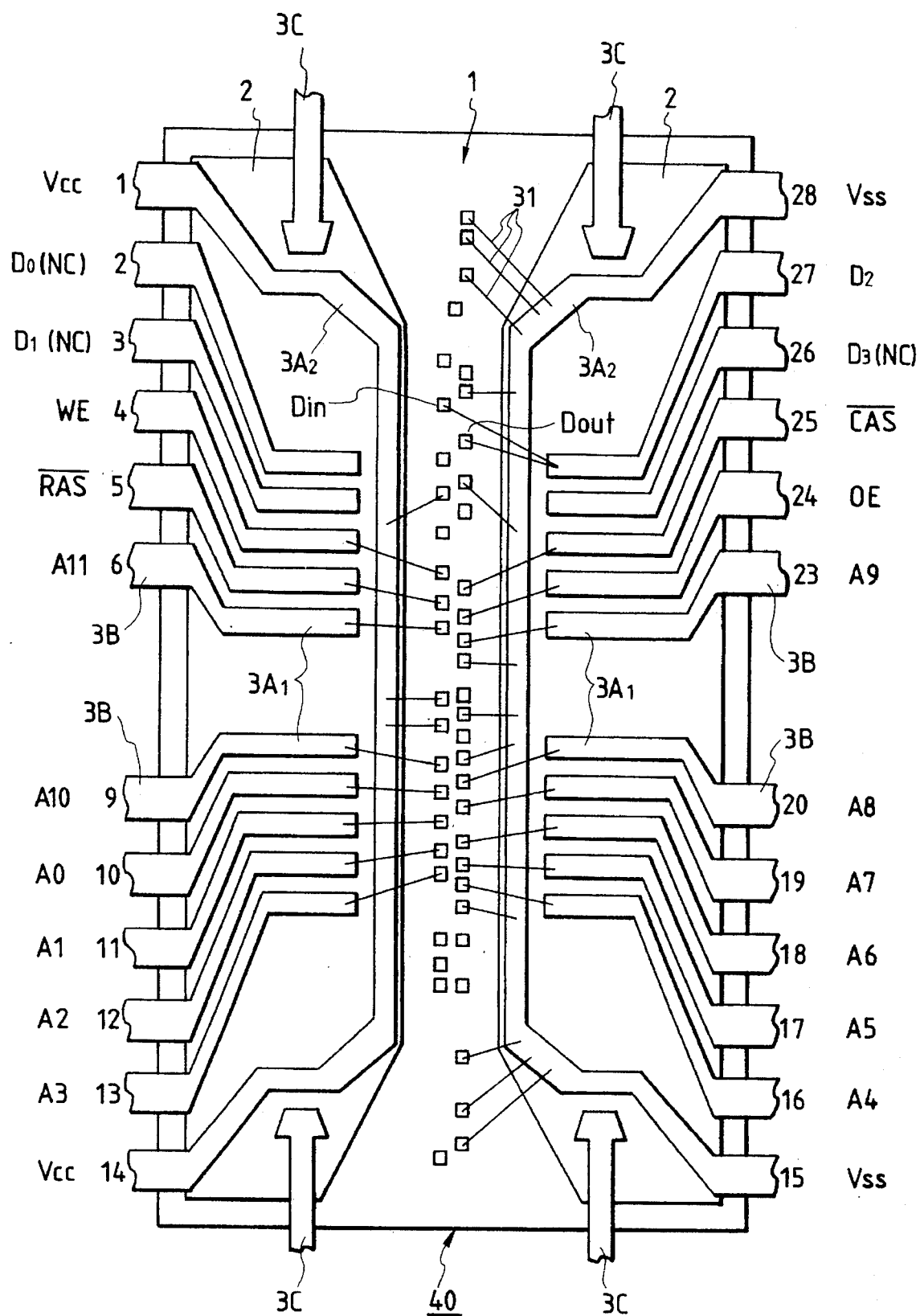

As for the 16 MDRAM 40C to be connected by bonding, its input/out terminals Din, Dout are connected to the 27th terminal D2 of the outer lead 3B by the bonding wire 31 as shown in FIG. 25.

Figure 26:
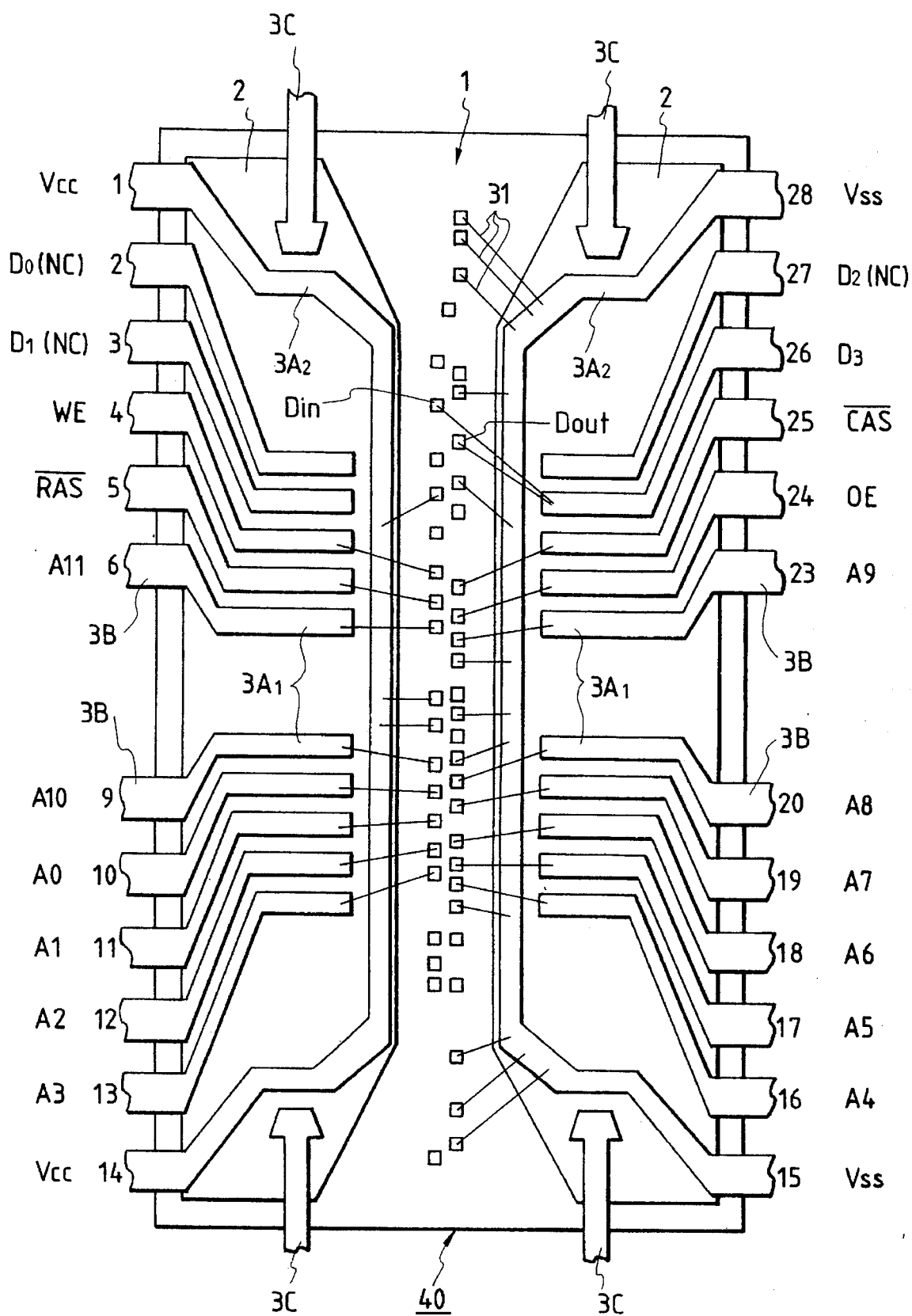

Regarding the 16 MDRAM 40D to be connected by bonding, its input/out terminals Din, Dout are connected to the 26th terminal D3 of the outer lead 3B by the bonding wire 31 as shown in FIG. 26.

In this manner, the bonding wires 31 are used to connect the respective input/output terminals Din, Dout of the 16 MDRAMs 40A, 40B, 40C, 40D and the terminals (D0–D3) of the outer leads 3B, so that the 64-bit (16M×4 bits) modular semiconductor device is brought to completion.

As only part of the principal surface of each 16 MDRAM (40A, 40B, 40C, 4D) is resin-molded, the package can be made substantially as large as the semiconductor chip in dimensions.

Moreover, as a portion other than part of the principal surface of each 16 MDRAM (40A, 40B, 40C, 40D) is exposed with the gap between the outer leads 3B in the lamination, air is allowed to pass therethrough and thereby heat dissipation efficiency can be improved.

Since the leads 3 are secured by the insulating adhesive tapes 2 to the respective principal surfaces of the 16 MDRAMs 40A, 40B, 40C, 40D, this arrangement ensures high device reliability against mechanical stress and mechanical stress deriving from heat.

Moreover, since the leads 3 are exposed even on the respective principal surfaces of the 16 MDRAMs 40A, 40B, 40C, 40D, such a stacked module can readily be fabricated by only stacking them and bonding the leads thereto.

Since the stack adherend faces provided by bending the outer leads 3B toward the rear surfaces of the 16 MDRAMs 40A, 40B, 40C, 40D are arranged on the substantially same plane, not only the yield of stack adhesion but also the electrical reliability of the stack adherend face can be improved.

Figure 27:
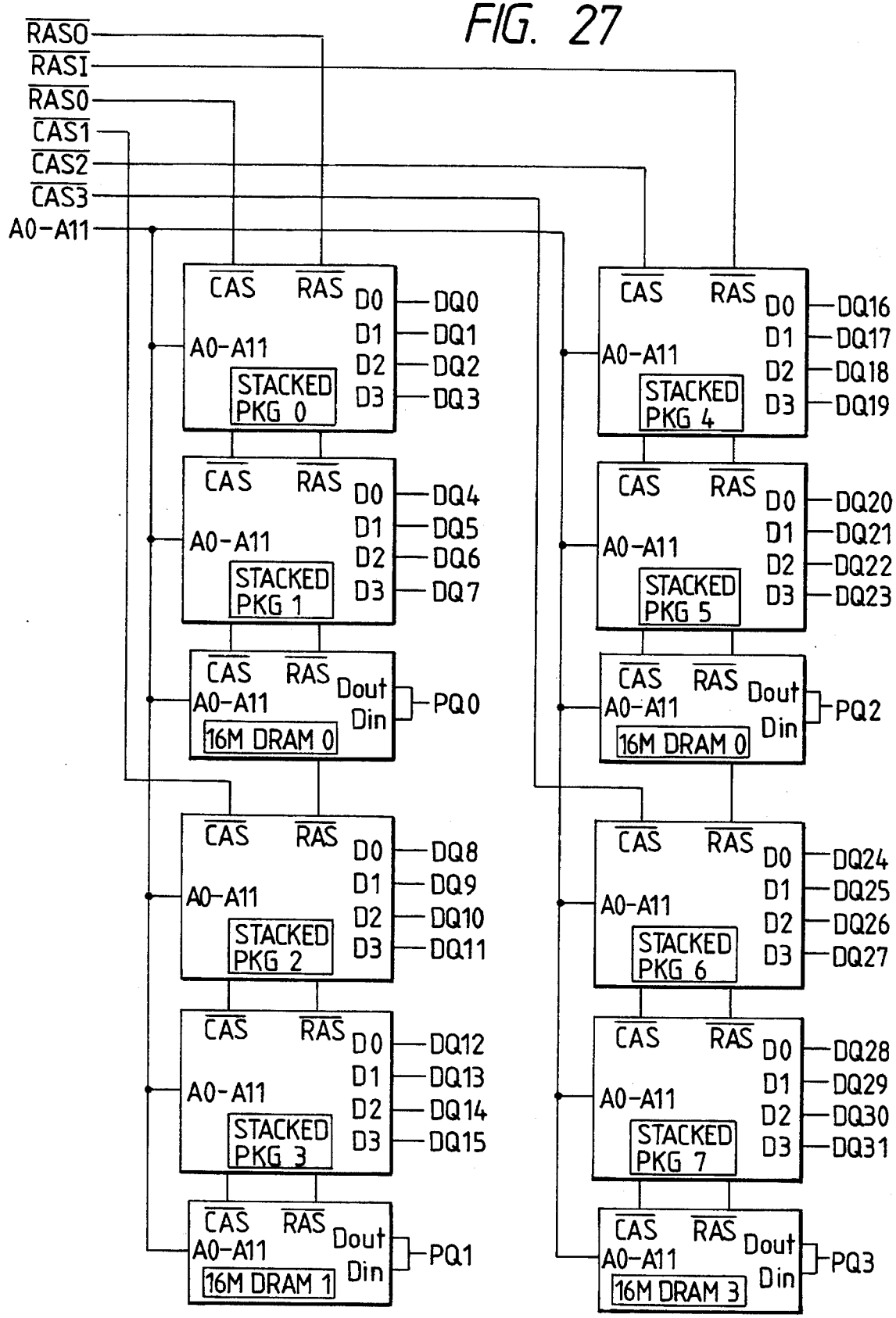
FIG. 27 is a diagram illustrating a modified embodiment 4.

FIG. 27 illustrates a 64 MDRAM modular (16777216 words×32 bits) system configuration as a modified embodiment 4.

It will readily be appreciated that this 64 MDRAM modules are also formed into a stacked semiconductor device as in the case of the embodiment 4. However, a detailed description of this modified embodiment is omitted.

Figure 28:
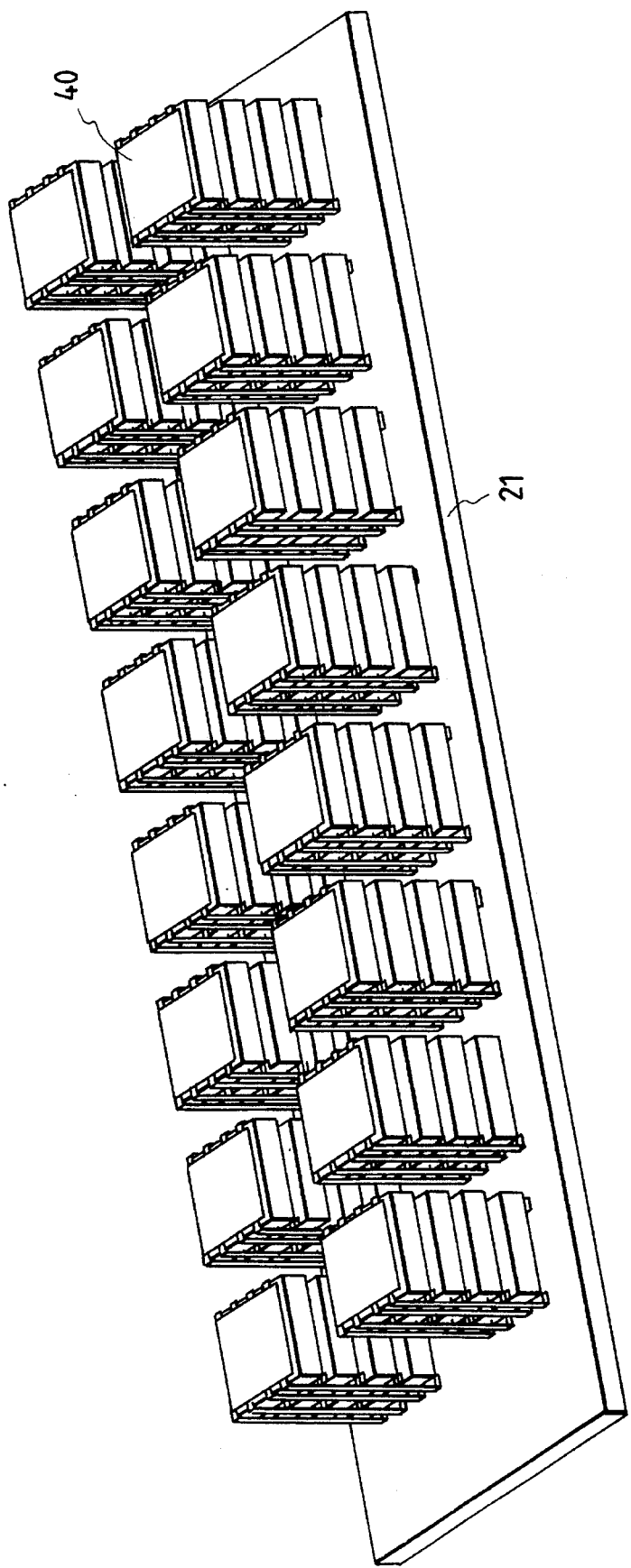
FIG. 28 is a diagram illustrating the plurality of stacked semiconductor devices in the embodiment 4 as packaged by bonding them with solder.

As shown in FIG. 28, for instance, a plurality of stacked semiconductor devices 40 in the embodiment 4 are joined to the wiring board 21 with solder. Although the lead pins are arranged on two sides in this embodiment, the present invention is also applicable to a case where a four-side arrangement is made.

Like the semiconductor device in the embodiment 3, those described in the embodiments 1, 2 may needless to say be applicable to the stacked modular semiconductor device in the embodiment 4.

As is obvious from the description given above, the single semiconductor device embodying the present invention can effectively be applied to memory units, microcomputers, logical units, gate array units and the like.

The stacked modular semiconductor device can also effectively be applied to memory cards, memory boards, cash cards and the like.

[Embodiment 5]

Figure 29:
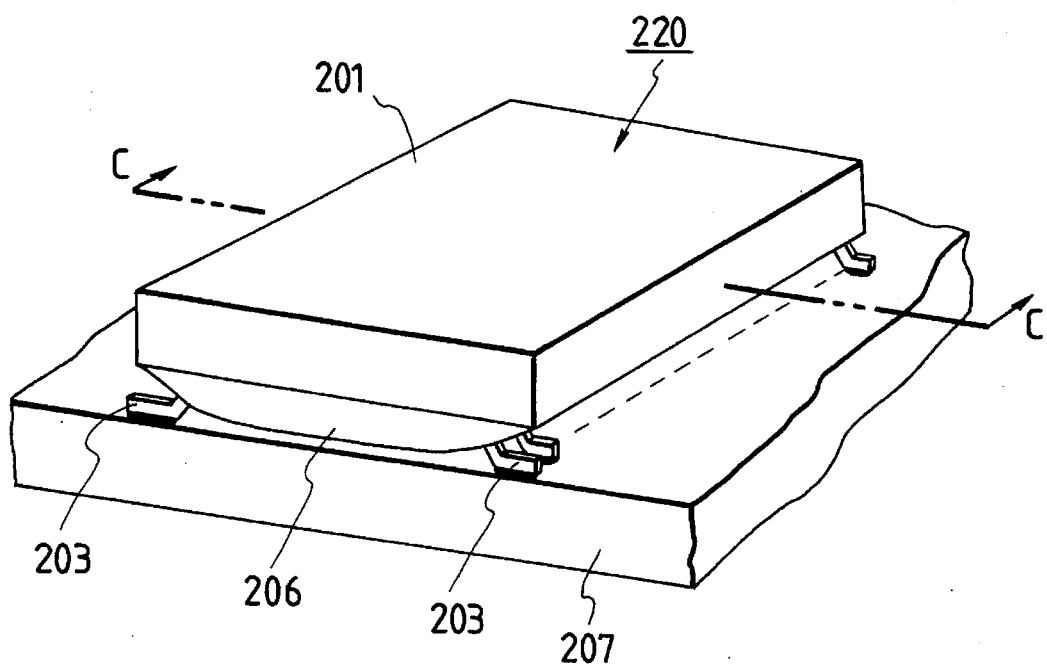
FIG. 29 is a perspective view of a small-sized resin-molded semiconductor device in the embodiment 1 of the present invention, illustrating its overall construction.

FIG. 29 is a perspective view of a small-sized resin-molded semiconductor device in the embodiment 1 of the present invention, illustrating its overall construction.

Figure 30:
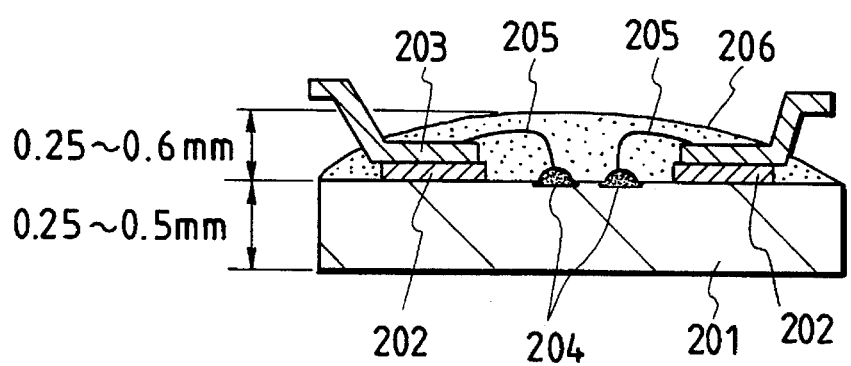
FIG. 30 is a sectional view of the principal part taken on line A—A of FIG. 1.
Figure 31:
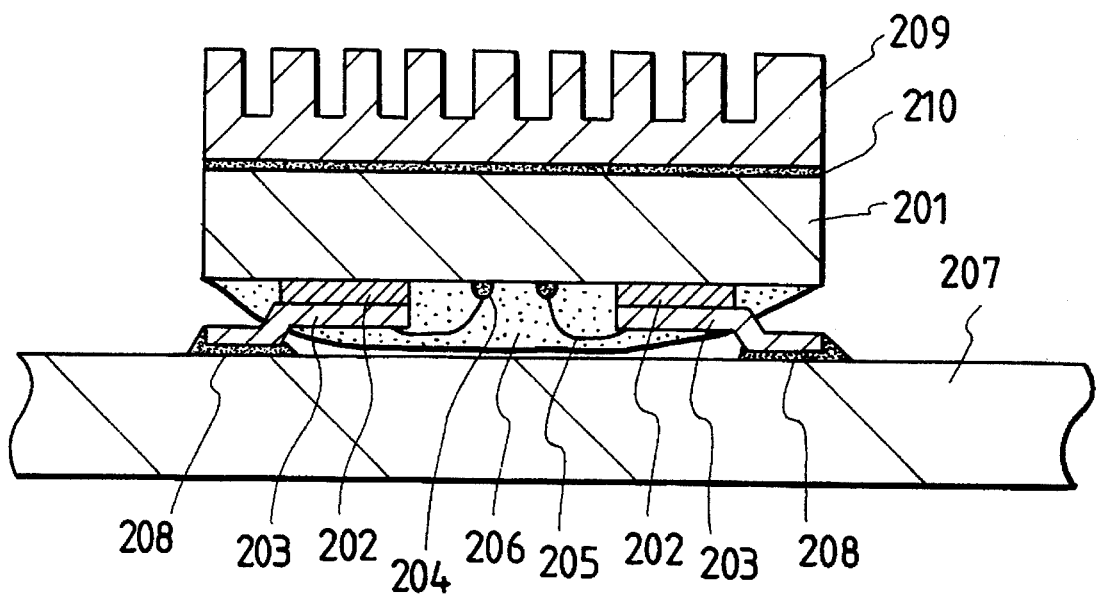
FIG. 31 is a sectional view of the semiconductor chip in the embodiment 1, illustrating its construction including a radiation fin provided on the rear surface thereof.

FIG. 30 is a sectional view taken on line C—C of FIG. 29.

In the small-sized resin-molded semiconductor device 220 in the embodiment 1, as shown in FIGS. 29 and 30, leads 203 are secured via insulating adhesive films 202 to the principal surface of a semiconductor chip 201 having circuits thereon and the leads 203 are fastened by wire bonding to the external terminals (aluminum electrodes) 204 of the semiconductor chip 201 with fine metal wires 205 such as gold wires so as to electrically connect them, respectively. The principal surface of the semiconductor chip 201 having circuits thereon is molded in liquid epoxy resin 206 or the like by potting. Then the outer leads of the leads 203 are bent as shown in FIG. 29 to complete the small-sized resin-molded semiconductor device.

The semiconductor chip 201 is, e.g., 0.2–0.5 mm thick; the liquid resin 206, e.g., 0.25–0.6 mm thick; the lead 203, e.g., 0.1–0.25 mm thick; and the insulating film (base) of the insulating adhesive film 202, e.g., 25–125 μm thick and the adhesive layer thereof, e.g., 10–30 μm thick.

Figure 36:
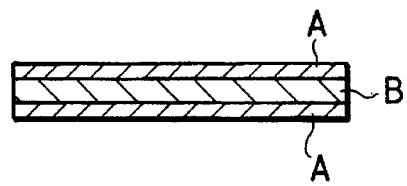
FIGS. 36 and 37 are sectional views of the insulating adhesive film in the embodiment 3, illustrating its construction.

The semiconductor chip 201 is a 16 MDRAM, for instance, and the lead 203 is made of 42Ni—Fe material. The insulating adhesive film 202 is, as shown in FIG. 36, of multilayer construction with the adhesive layers A sandwiching a base B, and composed of, e.g., polyetheramide-imide/captone/polyetheramideimide.

In the small-sized resin-molded semiconductor 220, as shown in FIG. 29, the lead 203 is joined to a wiring board 207 with solder.

As a result, no sealing resin exists in the side portion of the semiconductor chip 201 or it is otherwise in the form of a thin layer to the extent that the layer is formed by sagging at the time of resin potting, whereby it can be packaged substantially similar in dimensions to the semiconductor chip 201. Moreover, the package can be made as thin as about 0.6 mm because of absence of the sealing resin on the rear surface of the semiconductor chip 201.

Moreover, it is possible to improve heat dissipation efficiency by joining a radiation fin 209 to the other side of the semiconductor chip 201 with a heat conductive adhesive 210.

[Embodiment 6]

Figure 32:
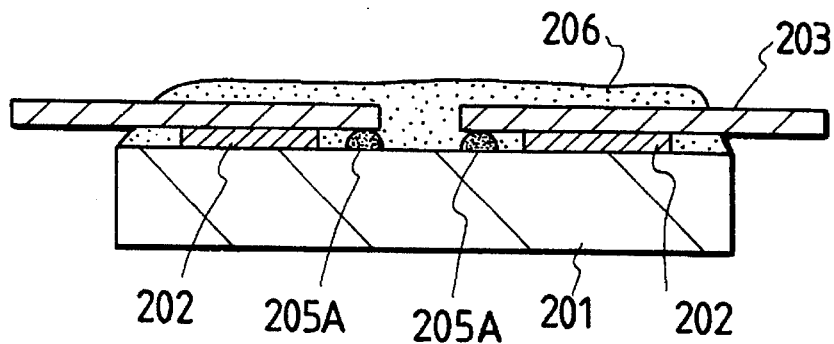
FIG. 32 is a sectional view of the principal part of an extra-thin resin-molded semiconductor device in the embodiment 2 of the present invention.

FIG. 32 is a sectional view of the principal part of an extra-thin resin-molded semiconductor device in the embodiment 2 of the present invention.

In the extra-thin resin-molded semiconductor device in the embodiment 2, as shown in FIG. 32, gold balls (Au) 205A are formed on the Al electrode on the principal surface of the semiconductor chip 201 having circuits thereon and the end of the tin(Sn)-plated inner lead of the lead 203 is directly thermocompression-bonded to the gold (Au) ball 205A and the lead 203 is fixed via the insulating adhesive film 202. The principal surface of the semiconductor chip 201 having circuits thereon is molded in the liquid epoxy resin 206 or the like by potting.

The gold (Au) ball 205A is made by, for instance, fastening a gold (Au) wire by head bonding and then removing the gold (Au) wire in a portion other than the ball.

Consequently, no sealing resin exists on the side portion of the semiconductor chip 201 or it is otherwise in the form of a thin layer to the extent that the layer is formed by sagging at the time of resin potting, whereby it can be packaged substantially similar in dimensions to the semiconductor chip 201. Moreover, the package can be made as thin as about 0.6 mm because of absence of the sealing resin on the rear surface of the semiconductor chip 201.

As the gold ball (Au) 205A is formed on the Al electrode on the principal surface of the semiconductor chip 201 having circuits thereon with the leading end of the tin(Sn)-plated inner lead of the lead 203 directly thermocompression-bonded to the gold (Au) ball 205A, such an extra-thin resin-molded semiconductor device is obtained.

Figure 33:
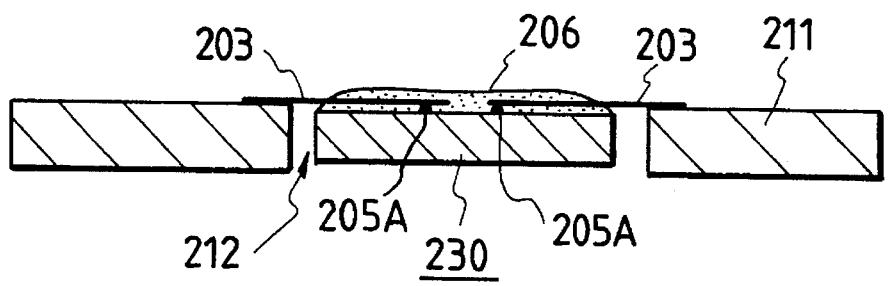
FIG. 33 is a sectional view of a small-sized extra-thin, resin-molded semiconductor device in the embodiment 2 of the present invention as packaged on a card board.

As shown in FIG. 33, a small-sized extra-thin resin-molded semiconductor device 230 like this is packaged in a packaging hole 212 provided in a card board 211.

[Embodiment 7]

Figure 34:
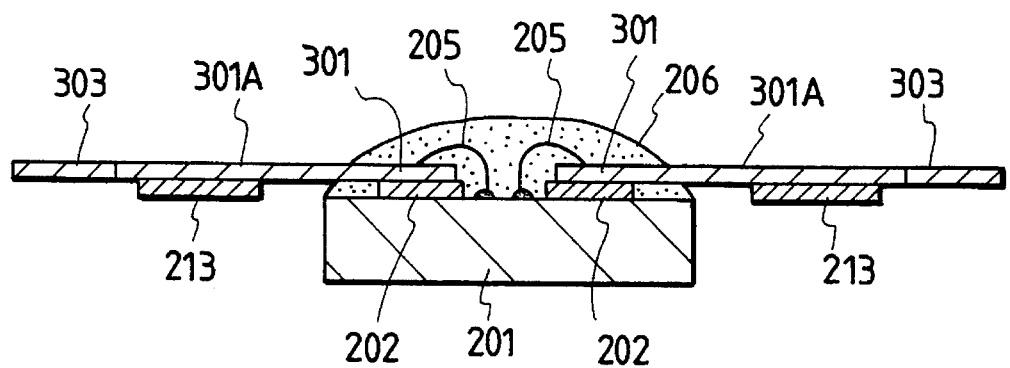
FIG. 34 is a sectional view of the principal part of a resin-molded semiconductor device in the embodiment 3 of the present invention.

FIG. 34 is a sectional view of the principal part of a resin-molded semiconductor device in the embodiment 3 of the present invention.

Figure 35:
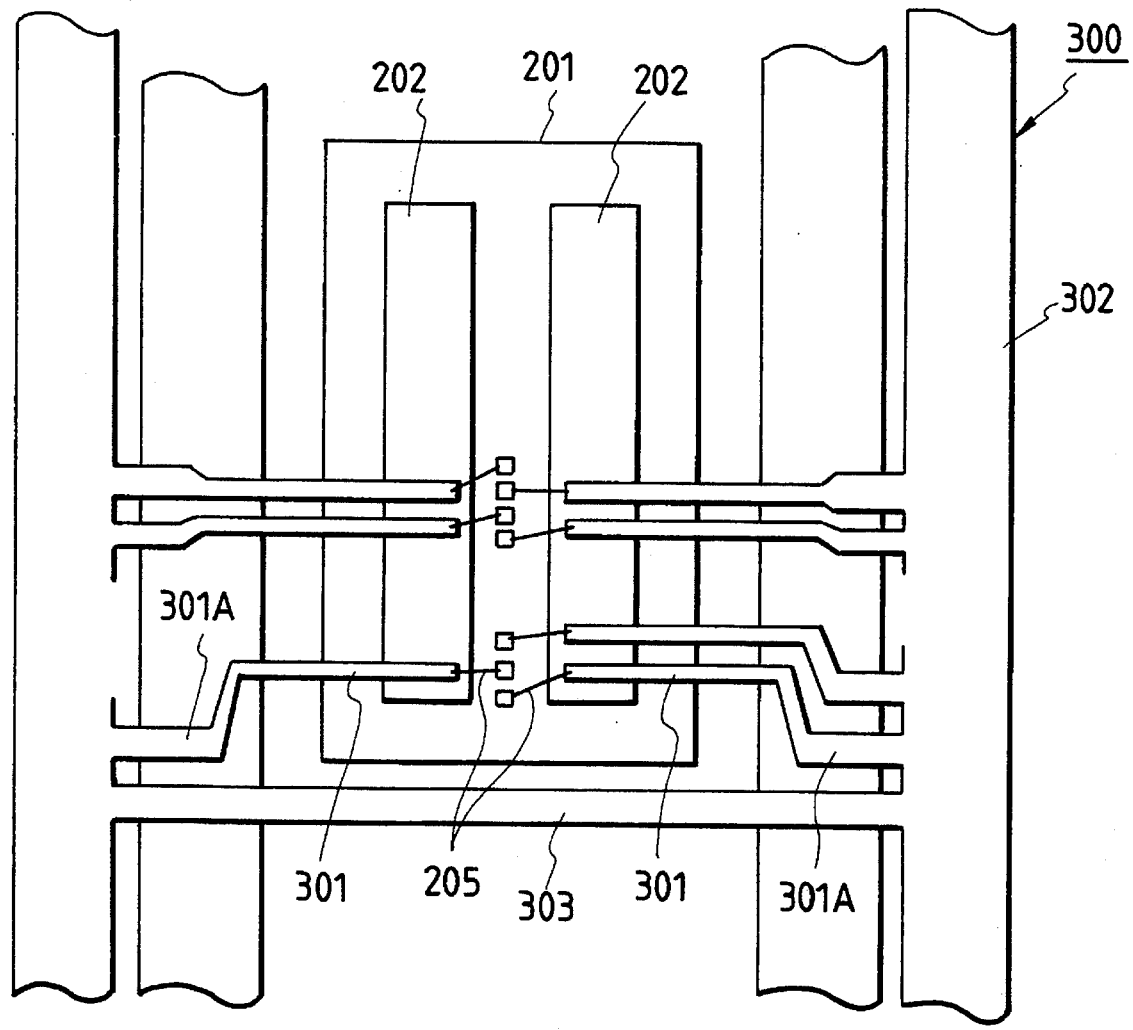
FIG. 35 is a plan view of the leadframe and the semiconductor chip in the embodiment 3, illustrating their mutual relation.

FIG. 35 is a plan view illustrating the relation between the leadframe and the semiconductor chip in the embodiment 3.

The resin-molded semiconductor device in the embodiment 3 is arranged so that by making the lead 203 of the resin-molded semiconductor device in the embodiment shown in FIGS. 29 and 30 extremely thin (i.e., the outer lead of the lead is formed so as to ease thermal stress), the thermal stress can be eased in such a state that the package has been soldered to the board.

More specifically, as shown in FIGS. 34 and 35, extremely thin leads 301 are secured via the insulating adhesive films 202 to the principal surface of the semiconductor chip 201 having circuits thereon and the leads 301 are fastened by wire bonding to the external terminals (aluminum electrodes) 204 of the semiconductor chip 201 with the fine metal wires 205 such as gold wires to electrically connect them, respectively. The principal surface of the semiconductor chip 201 having circuits thereon is molded in the liquid epoxy resin 206 or the like by potting.

The outer lead of the lead 301 is provided with a reinforcing insulating adhesive tape 213.

In FIG. 35, numeral 300 refers to a leadframe, 301A to an outer lead of the lead 301, and 302, 303 to outer frames of the leadframe.

Figure 37:
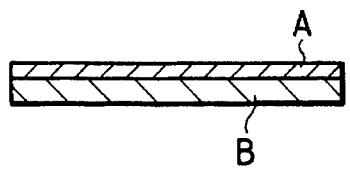

The lead 301 is, e.g., 20–100 μm thick; and the insulating film (base) of the insulating adhesive film 202, e.g., 25–125 μm thick and the adhesive layer thereof, e.g., 10–30 μm. The semiconductor chip 201 is, for instance, a 16 MDRAM. The lead 301 is made of 42Ni—Fe material and, e.g., 20–150 μm thick. The insulating adhesive film 202 is, as shown in FIG. 36, of multilayer construction with the base B interposed between the adhesive layers A and composed of, e.g., polyetheramideimide 25 μm/captone 50 μm/polyetheramideimide 25 μm. The reinforcing insulating adhesive tape 213 is, as shown in FIG. 37, of multilayer construction with the adhesive layer A and the base B and composed of, e.g., polyetheramideimide 25 μm/captone 50 μm.

Incidentally, the captone may replace any other polyimide film.

Figure 38:
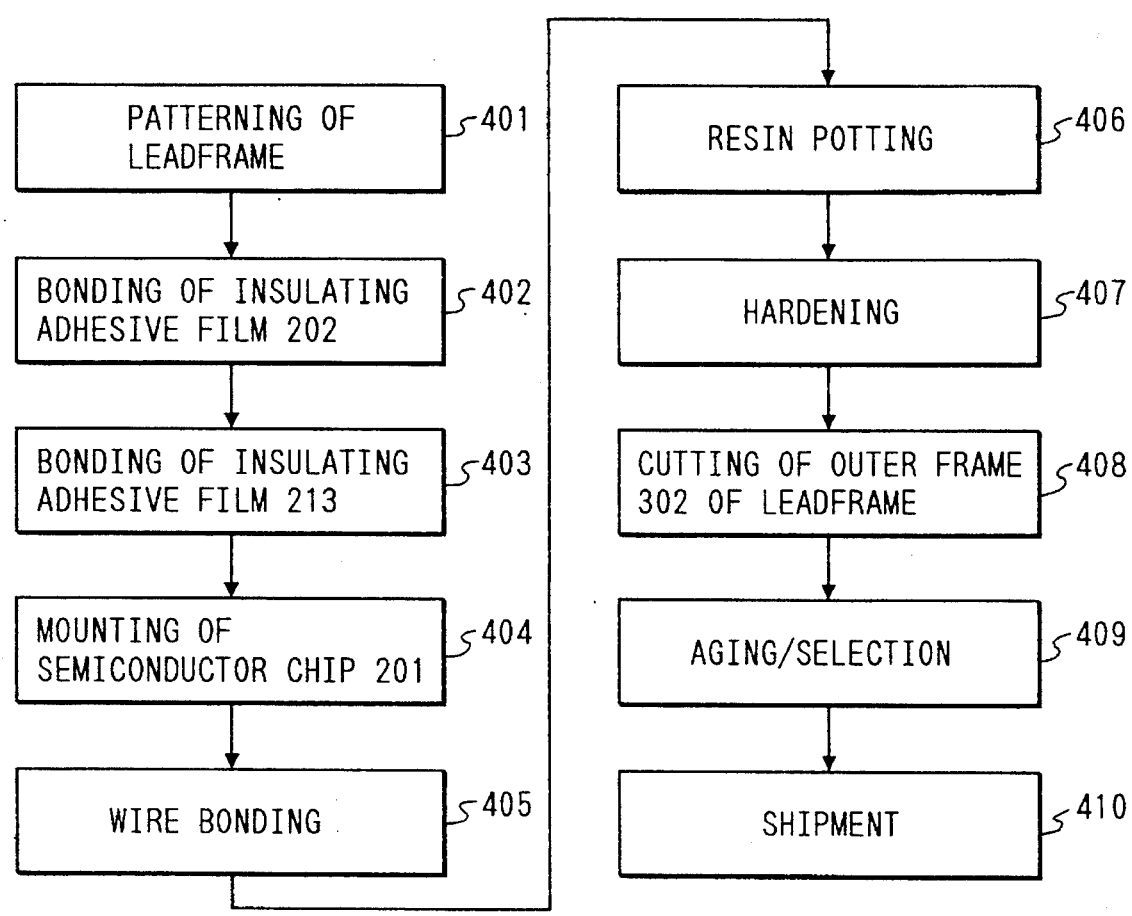
FIG. 38 is a flowchart illustrating the steps of assembling the resin-molded semiconductor device in the embodiment 3.

A description will subsequently be given of steps of procedure for assembling the resin-molded semiconductor device embodying the present invention along with a flowchart of FIG. 38.

First, the patterning of the leadframe 300 is made by etching or pressing (Step 401). Subsequently as shown in FIG. 35, the insulating adhesive film (adhesive layer/base/adhesive layer) 202 and the reinforcing adhesive tape (adhesive layer/base) 213 are stuck to the leadframe 300 thus patterned thereafter under the following conditions: 300°–400° C., 10°–100 kg/cm², 3–10 sec. (Steps 402, 403). Then the semiconductor chip 201 is bonded to the leadframe 300 under the same condition; namely 300°–400° C., 10–100 kg/cm², 3–10 sec. (Step 404).

With the simultaneous use of ultrasonic vibration, the gold wires 205 having a diameter of 30 μm are fastened by thermocompression wire bonding at 200° C. (Step 405).

Then the principal surface of the semiconductor chip 201 having circuits thereon is molded in the liquid epoxy resin 206 by potting (Step 406). The resin is heated at 180° C. for one hour before being hardened by heating at 150° C. for five hours (Step 407).

Subsequently, the outer frame 302 of the leadframe 300 is cut off (Step 408) and subjected to aging/selection (Step 409) and then shipped (Step 410).

On the part of users, the outer leads 301A of the leads 301 are shaped as desired and the outer frame 303 as well as the reinforcing insulating adhesive tape (adhesive layer/base) 213 is cut so that the semiconductor device is mounted on a wiring board.

Thermal stress can thus be eased by thinning the leads 301 when the semiconductor device is mounted with solder on the board and thermal stress deriving from temperature stress can also be eased in such a state that the semiconductor device has been mounted thereon.

As a series of operations including assembly, selection and shipment can be performed with the reinforcing insulating adhesive tape 213 being stuck, the leads are prevented from deforming and being damaged.

Figure 39:
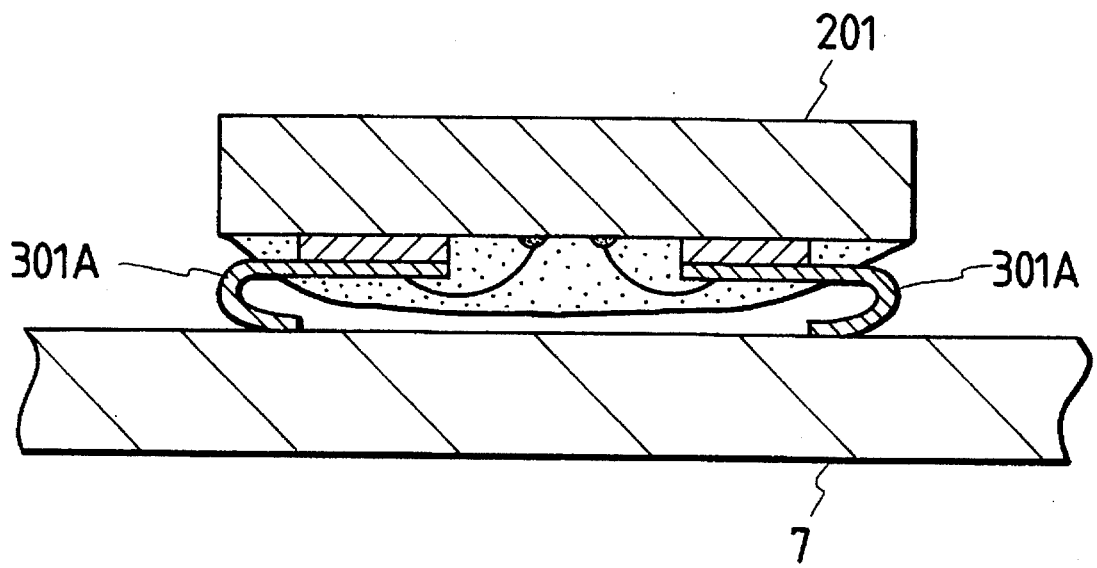
FIG. 39 is a diagram illustrating a modified resin-molded semiconductor device in the embodiment 3.

In order to ease thermal stress when the semiconductor device is mounted with solder on the board and thermal stress resulting from temperature stress in such a state that the semiconductor device has been mounted thereon, the outer leads 301A of the leads 301 may be bent so as to give them elasticity as shown in FIG. 39.

[Embodiment 8]

Figure 40:
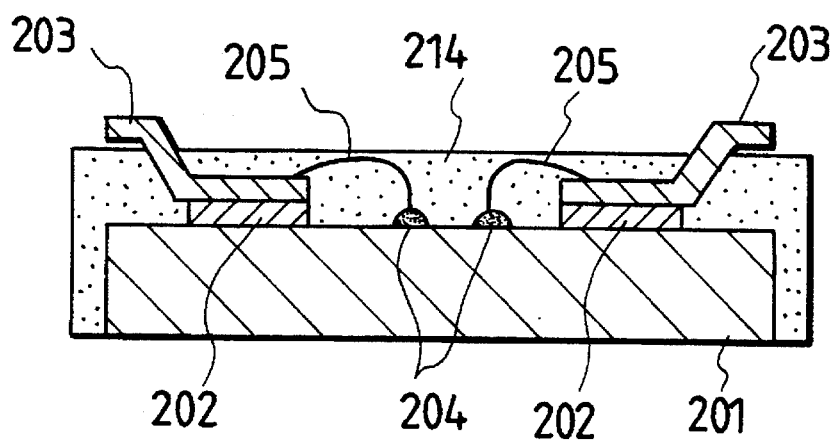
FIG. 40 is a sectional view of the principal part of a resin-molded semiconductor device in the embodiment 4 of the present invention.

FIG. 40 is a sectional view of the principal part of a resin-molded semiconductor device in the embodiment 4 of the present invention.

In the resin-molded semiconductor device in the embodiment 4, as shown in FIG. 40, the principal surface and the side portions of the semiconductor chip 201 are sealed by transfer molding with epoxy resin powder or the like. Numeral 214 represents the resin-molded portion.

With this arrangement, the resin-molded portion can be made uniform in shape and this contributes to increasing reliability.

Although the present invention has been described with the specific embodiments thereof, the present invention is not limited in application to the preceding embodiments but may needless to say be modified in various ways without departing from the spirit and the scope of the invention as hereinafter claimed.

The effects obtained from the exemplary embodiments of the present invention disclosed in this application may be described briefly as follows:

(1) The package can be made substantially equal in dimensions to the semiconductor chip.

(2) Heat dissipation efficiency can be improved.

(3) Highly reliable semiconductor devices ensuring against mechanical stress and what derives from heat can be provided.

(4) Laminated semiconductor devices can readily be fabricated.

(5) As ordinary leadframes made by pressing or etching are usable, production cost can be reduced.

(6) Packaging density can be increased.

(7) As only the principal surface or the principal surface and side portions of the semiconductor chip are resin-molded, the package can be made substantially equal in dimensions to the semiconductor chip. As the principal surface and the opposite portion of the semiconductor chip are exposed, the overall thickness of the package can be decreased and heat dissipation efficiency can also be improved.

(8) As the outer leads of the leads are so shaped as to be fit for making a package thin-gage with flat packaging, extra-thin packages can be made available.

(9) As the outer lead portions of the leads are so shaped as to ease thermal stress, the thermal stress can be eased when the semiconductor device is mounted with solder on the board and thermal stress deriving from temperature stress can also be eased in such a state that the semiconductor device has been mounted on the board.

(10) As the leads and the external terminals of the semiconductor chip are electrically connected by the wires, the metal balls or metal bumps, ordinary leadframes made by pressing or etching are usable with the effect of reducing production cost.

What is claimed is:

1. A semiconductor device comprising:

a semiconductor chip having a principal and a rear surface, said principal and rear surfaces each comprising a rectangular-shaped plane surface, and a plurality of external terminals formed on said principal surface;

a plurality of leads, each including a first portion, which is electrically connected to an external terminal, arranged on and substantially parallel to said principal surface, said first portions of said leads being electrically connected with said external terminals by bonding wires, a second portion arranged over and substantially parallel to said principal surface, said second portion being positioned farther from said principal surface than the position of said first portion and having a portion for electrically connecting with an external device, and a third portion electrically connected between said first portion and said second portion; and a sealing material sealing said external terminals, said first portions of said leads and said bonding wires, wherein all of said first portions of leads in which said bonding wires are connected are positioned on said principal surface, wherein adjacent leads of said plurality of leads which are electrically connected with adjacent external terminals extend in the same direction as each other;

wherein said first and third portions, and said portions of the second portions for electrically connecting with said external device are positioned in an area of said substantially rectangular-shaped plane surface.

2. A semiconductor device according to claim 1, wherein said first, second and third portions are positioned in an area of said substantially rectangular-shaped plane surface.

3. A semiconductor device according to claim 1, further comprising:

a radiation fin for dissipating heat, said radiation fin being joined to said rear surface of said semiconductor chip with a heat conductive adhesive.

4. A semiconductor device according to claim 1, wherein side surfaces of said semiconductor chip between said principal surface and said rear surface are sealed with said sealing material.

5. A semiconductor device according to claim 1, wherein said external terminals are arranged in a central part of said rectangular-shaped principal surface of said semiconductor chip and are extended in a direction substantially parallel to longer sides of said rectangular-shaped principal surface.

6. A semiconductor device according to claim 1, wherein said sealing material is a sealing resin.

7. A semiconductor device according to claim 1, wherein said first portions are electrically connected to said external terminals by wires.

8. A semiconductor device according to claim 1, wherein said second portions of said leads are joined to a board with solder.

9. A semiconductor device according to claim 8, wherein said first, second and third portions are positioned in an area of said substantially rectangular-shaped plane surface.

10. A semiconductor device according to claim 8, further comprising:

a radiation fin for dissipating heat, said radiation fin being joined to said rear surface of said semiconductor chip with a heat conductive adhesive.

11. A semiconductor device according to claim 8, wherein side surfaces of said semiconductor chip between said principal surface and said rear surface are sealed with said sealing material.

12. A semiconductor device according to claim 8, wherein said external terminals are arranged in a central part of said rectangular-shaped principal surface of said semiconductor chip and are extended in a direction substantially parallel to longer sides of said rectangular-shaped principal surface.

13. A semiconductor device according to claim 8, wherein said sealing material is a sealing resin.

14. A semiconductor device according to claim 8, wherein said first portions are electrically connected to said external terminals by wires.

15. A semiconductor device according to claim 1, wherein said second portions and second parts of said third portions are not sealed by said sealing material.

16. A semiconductor device according to claim 8, wherein said second portions and second parts of said third portions are not sealed by said sealing material.

17. A semiconductor device according to claim 1, wherein said external terminals are arranged in two rows, and wherein said adjacent external terminals are external terminals which adjoin each other in one row.

18. A semiconductor device comprising:

a semiconductor chip having a first surface, a second surface opposing said first surface and external terminals formed on said first surface; and a plurality of leads arranged on said first surface of said semiconductor chip, each of said plurality of leads having a first end portion and a second end portion, said first end portions of said plurality of leads being electrically connected with said external terminals by bonding wires, each of said second portions including a portion for electrically connecting with an external device, wherein all of said first portions of said plurality of leads to which said bonding wires are connected are positioned on said first surface, wherein said first and second end portions are positioned in an area of said first surface of said semiconductor chip, and wherein adjacent leads of said plurality of leads which are electrically connected with adjacent external terminals extend in the same direction as each other.

19. A semiconductor device according to claim 18, wherein said external terminals are arranged in two rows, and wherein said adjacent external terminals are arranged in one of said two rows.

20. A semiconductor device according to claim 18, wherein said first and second end portions of said plurality of leads are arranged substantially in parallel to said first surface of said semiconductor chip, and wherein said second end portions are positioned farther from said first surface than the position of said first end portions.

21. A semiconductor device according to claim 20, wherein a height of said second end portions from said first bonding surface is higher than a peak height of a wire loop of said bonding wires from said first surface.

22. A semiconductor device according to claim 20, further comprising an encapsulator sealing said first end portions of said plurality of leads and said bonding wires, and wherein a height of said encapsulator from said first surface is lower than a height of said second end portions from said first surface.

23. A semiconductor device according to claim 18, further comprising an insulating adhesive film formed between said first end portions and said first surface, wherein said first end portions are fixed on said first surface by said insulating adhesive film.

24. A semiconductor device comprising:

a semiconductor chip having a principal and a rear surface, said principal and rear surfaces each comprising a rectangular-shaped plane surface, and a plurality of external terminals formed on said principal surface;

a plurality of leads, each including a first portion, which is electrically connected to an external terminal, arranged on and substantially parallel to said principal surface, and fixed on said principal surface by an insulating adhesive film, said first portions of said leads being electrically connected with said external terminals by bonding wires, a second portion arranged over and substantially parallel to said principal surface, said second portion being positioned farther from said principal surface than the position of said first portion and having a portion for electrically connecting with an external device, and a third portion electrically connected between said first portion and said second portion wherein said plurality of leads are the only leads fixed to said semiconductor chip; and a sealing material sealed over said principal surface of said semiconductor chip, said first portions, a first part of said third portions and said insulating adhesive film, wherein all of said first portions of leads in which said bonding wires are connected are positioned on said principal surface, and wherein said first and third portions, and said portions of the second portions for electrically connecting with said external device are positioned in an area of said substantially rectangular-shaped plane surface.

25. A semiconductor device according to claim 24, wherein said first, second and third portions are positioned in an area of said substantially rectangular-shaped plane surface.

26. A semiconductor device according to claim 24, further comprising:

a radiation fin for dissipating heat, said radiation fin being joined to said rear surface of said semiconductor chip with a heat conductive adhesive.

27. A semiconductor device according to claim 24, wherein side surfaces of said semiconductor chip between said principal surface and said rear surface are sealed with said sealing material.

28. A semiconductor device according to claim 24, wherein said sealing material is a sealing resin.

29. A semiconductor device according to claim 24, wherein said first portions are electrically connected to said external terminals by wires.

30. A semiconductor device according to claim 24, wherein said second portions of said leads are joined to a board with solder.

31. A semiconductor device according to claim 30, wherein said first, second and third portions are positioned in an area of said substantially rectangular-shaped plane surface.

32. A semiconductor device according to claim 30, further comprising:
a radiation fin for dissipating heat, said radiation fin being joined to said rear surface of said semiconductor chip with a heat conductive adhesive.

33. A semiconductor device according to claim 30, wherein side surfaces of said semiconductor chip between said principal surface and said rear surface are sealed with said sealing material.

34. A semiconductor device according to claim 30, wherein said sealing material is a sealing resin.

35. A semiconductor device according to claim 30, wherein said first portions are electrically connected to said external terminals by wires.

36. A semiconductor device according to claim 24, wherein said second portions and second parts of said third portions are not sealed by said sealing material.

37. A semiconductor device according to claim 30, wherein said second portions and second parts of said third portions are not sealed by said sealing material.

38. A semiconductor device according to claim 24, wherein said external terminals are arranged in a central part of said rectangular-shaped principal surface of said semiconductor chip and are extended in a direction substantially parallel to longer sides of said rectangular-shaped principal surface.

39. A semiconductor device according to claim 30, wherein said external terminals are arranged in a central part of said rectangular-shaped principal surface of said semiconductor chip and are extended in a direction substantially parallel to longer sides of said rectangular-shaped principal surface.

* * * * *